United States Patent
Masuda et al.

(10) Patent No.: US 7,312,447 B2
(45) Date of Patent: Dec. 25, 2007

(54) ELECTRON BEAM DEPICTING METHOD, MOTHER DIE MANUFACTURING METHOD, MOTHER DIE, METALLIC MOLD MANUFACTURING METHOD, METALLIC MOLD AND OPTICAL ELEMENT

(75) Inventors: Osamu Masuda, Hino (JP); Kazumi Furuta, Akishima (JP)

(73) Assignee: Konica Minolta Holdings Inc., Tokyo (JP)

( * ) Notice: Subject to any disclaimer, the term of this patent is extended or adjusted under 35 U.S.C. 154(b) by 778 days.

(21) Appl. No.: 10/796,885

(22) Filed: Mar. 8, 2004

(65) Prior Publication Data
US 2004/0185354 A1   Sep. 23, 2004

(30) Foreign Application Priority Data
Mar. 20, 2003 (JP) .............................. 2003-076980

(51) Int. Cl.
*H01J 37/29* (2006.01)
(52) U.S. Cl. .................................. 250/310; 250/396 R
(58) Field of Classification Search ................ 250/310, 250/396 R, 492.3
See application file for complete search history.

(56) References Cited

U.S. PATENT DOCUMENTS
2004/0173921 A1 *  9/2004  Furuta et al. ............... 264/1.31

FOREIGN PATENT DOCUMENTS
JP   2002-333722 A   11/2002

* cited by examiner

*Primary Examiner*—Kiet T. Nguyen
(74) *Attorney, Agent, or Firm*—Frishauf, Holtz, Goodman & Chick, P.C.

(57) ABSTRACT

There is described a method for depicting a predetermined pattern, such as a diffraction pattern employed in an optical element, on a substrate. The method includes the steps of: acquiring shape data of the predetermined pattern; generating a first input signal for deflecting an electron beam emitted from an electron gun in a main-scanning direction, and a second input signal for deflecting the electron beam in a sub-scanning direction, based on the shape data of the predetermined pattern; adjusting an alternating bias signal, having a specific frequency, according to the shape data of the predetermined pattern; superposing the alternating bias signal on the second input signal; and deflecting the electron beam emitted from the electron gun in the sub-scanning direction according to the second input signal on which the alternating bias signal is superposed, while scanning the electron beam by deflecting it in a main-scanning direction.

13 Claims, 18 Drawing Sheets

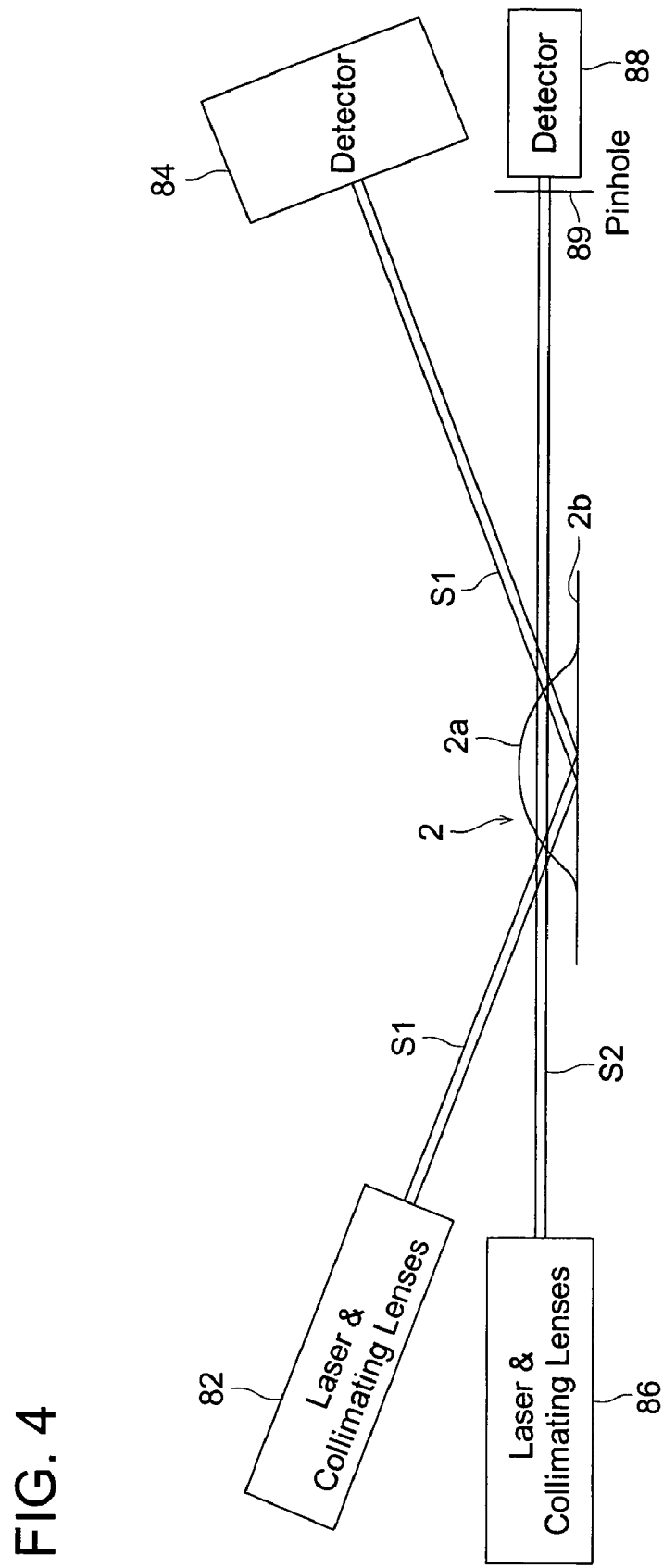

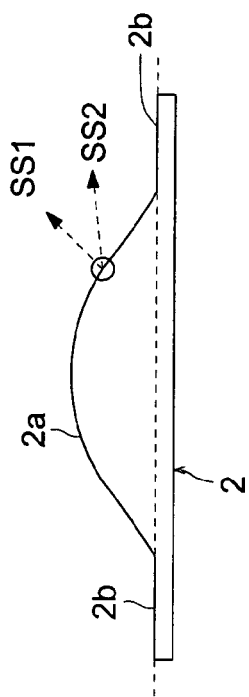
FIG. 5(C)
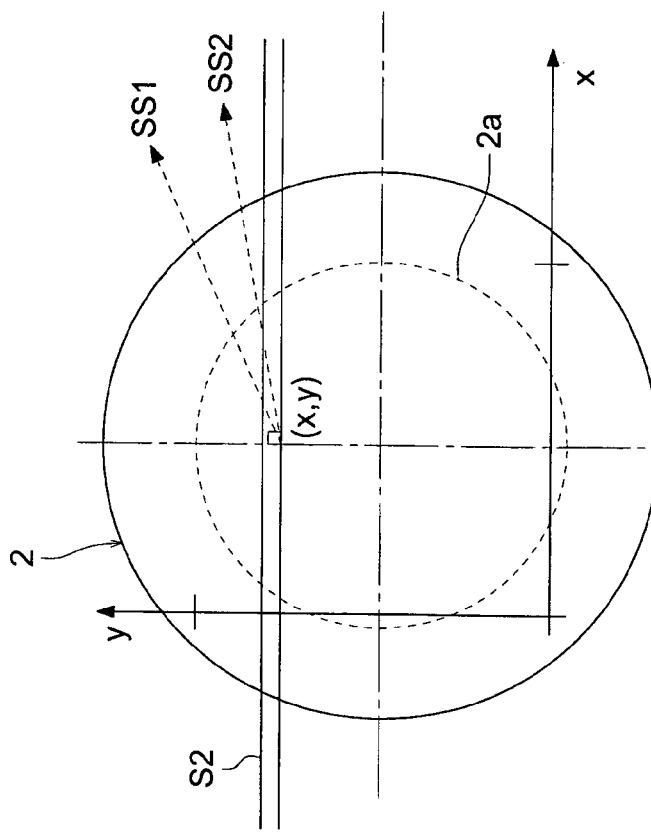
FIG. 5(A)
FIG. 5(B)

(DEFLECTION SIGNAL ACCORDING TO PRIOR ART)

(DEFLECTION SIGNAL WITH ALTERNATING BIAS SIGNAL SUPERPOSED THEREON)

< WITHOUT SUPERPOSING >

< WITH SUPERPOSING >

ELECTRON BEAM DEPICTING METHOD, MOTHER DIE MANUFACTURING METHOD, MOTHER DIE, METALLIC MOLD MANUFACTURING METHOD, METALLIC MOLD AND OPTICAL ELEMENT

BACKGROUND OF THE INVENTION

The present invention relates to an electron beam depicting technique and, particular to a technique for applying electron beams to form a predetermined pattern, for example, a diffraction pattern corresponding to an optical element, on a substrate as an exposure target.

In recent years, a CD and DVD, for example, are widely used as an information-recording medium, and many optical elements are used in the precision apparatus such as reading apparatus for reading such a recording medium. To ensure reduced costs and compact configuration, a plastic optical lens, rather than a glass-made lens, is more often used as the optical element such as an optical lens employed in this apparatus.

The aforementioned plastic optical lens is manufactured by general injection molding, and the metallic molds used for injection molding operation are formed by general cutting operations.

In recent, years, the required level of specifications and performances of the optical element has been raised. For example, when manufacturing the optical element having a diffraction structure on the optically functioning surface, the metallic mold must be provided with a surface for forming a diffraction structure in order to carry out injection molding of the optical element.

However, if an attempt is made to form a fine configuration such as a diffraction structure on a metallic mold by a cutting tool employed in the molding technique or working technique currently employed, working accuracy is deteriorated and the strength and service life of the cutting tool are reduced. Thus, precision working on the order of submicrons or even less has been difficult so far.

Especially in the pickup lens used in the medium such as a DVD, as compared with the CD-ROM pickup lens, diffraction structure of higher precision is required to cope with an increase in the recording density. The required working accuracy is on the level smaller than the light wavelength, for example, on the order of nm. The prior art working method, however, has failed to meet such high-precision working requirements.

In the meantime, to form a predetermined pattern on the surface of a substrate including an optical element, an optical aligning method, for example, a method using an aligner based on mask exposure technique has been employed.

By way of an example, an aligner for patterning a predetermined shape on the surface of a substrate such as the wafer substrate (photo mask) of a semiconductor may be used for patterning on the surface of the aforementioned optical element or for machining of a metallic mold. However, the apparatus for wafer substrate has a problem in that only a flat material can processed. Further, in the apparatus for wafer substrate, the working depth of the substrate is controlled in terms of exposure energy. However, in the case of precision working of a diffraction grating for optical elements and others or creation of a photonic crystal, the structure shorter than the wavelength of the applied light must be accurately formed on a non-planar surface such as a lens. Thus, an aligner according to the aforementioned control method is not suitable for fine patterning of the required level.

A laser beam method is another candidate for consideration. Laser beam is sometimes used for working on the order of microns, but the beam diameter is optically controlled, and beam convergence is limited. In this sense, this method is not suited for working on the order of submicrons, especially on the level close to the wavelength of light. Further, since a sufficient depth of focus cannot be obtained, it is necessary to utilize such a mechanical means as auto focusing at all times. This is one of the causes for discouraging high-precision working. Especially when high precision is required in the patterning of an optical element having a curved surface (including a 3D configuration having a surface changing on a macroscopic scale), this problem becomes serious.

Thus, this art can be employed in the patterning of a substrate having a planar form, but is not suited for forming a fine pattern on the substrate having a dynamic 3D configuration such as a curve. This has created a problem in this art.

To manufacture a metallic mold for such an optical lens, an attempt has been made to use an electron beam depicting apparatus to form a diffraction structure on the optical function surface of the optical element serving as the mother die. (See the Patent Document 1, for example).

In the aforementioned electron beam depicting apparatus, electron beam is applied to the surface of a substrate as a model of the optical lens. A predetermined dose of beam is used to perform scanning operation within a predetermined, whereby binary or blaze-shaped diffraction structure is formed.

[Patent Document 1]
Tokkai 20002-333722 (Japanese Laid Open Patent Publication)

Incidentally, the minimum resolution of dose (hereinafter referred to as "minimum dose resolution") is determined by the minimum time resolution of the analog-to-digital converter of the electron beam depicting apparatus. Therefore, dose adjustment is made in a conspicuously stepwise manner, especially when patterning is to be performed at a high current value within a limited time. Thus, even if efforts are made to form a smooth sloped blaze surface in the formation of a blaze-shaped diffraction structure, the sloped surface of the blaze obtained after development of the substrate becomes stepwise in shape, due to the magnitude of the aforementioned minimum dose resolution. This has created a problem in this art.

If the sloped surface of the blaze becomes stepwise in shape as described above, the optical characteristics of the optical lens are deteriorated; with the result that diffraction efficiency is reduced in particular. Further, when the consideration is given to the product quality, the aforementioned disadvantage will cause product value to be reduced. To improve the diffraction efficiency of the optical lens and to enhance product value, the sloped surface of the blaze must be made as smooth as possible in shape.

To solve such problems, it would be possible to perform patterning using a large beam diameter (at the defocusing position of electron beam, for example), thereby getting a smooth shape of the sloped surface of the blaze obtained after development of the substrate. In this case, however, a problem arises in that the rising shape becomes less sharp in the edge portion of the blaze.

When the rising shape becomes less sharp in the edge portion of the blaze as described above, the optical characteristics of the optical lens are degraded, and the diffraction efficiency in particular is deteriorated. Further, when the consideration is given to the product quality, the aforementioned disadvantage will cause product value to be reduced. To improve the diffraction efficiency of the optical lens and to enhance product value, the rising shape in the edge portion of the blaze must be made as sharp as possible.

In the meantime, the electron beam applied in the form of having a large beam diameter has the disadvantage of being seriously subjected to external disturbances. Further, in the commonly employed electron beam depicting apparatus based on spot beam method and others, the diameter of electron beam is set within the range from several nanometers to several tens of nanometers. If the diameter of electron beam is made larger, aberration or other defect will occur, and practical utility will be reduced.

To solve such a problem, the following technique can be considered: When the dose of electron beam is changed from the first dose to the second dose (where the difference between the first and second doses is equivalent to the dose of minimum adjustment unit based on the analog-to-digital converter minimum clock) while using a small-diameter beam for the purpose of patterning the sloped surface of the blaze, a sloped portion of different doses is provided, where the portion formed by both the first and second doses is present between the portion of the substrate formed by the first dose and that formed by the second dose. After development, the sloped portion of different doses is formed to have a height intermediate between the height of the portion of the substrate formed by the first dose and that of the portion formed by the second dose, with the result that the sloped portion of the blaze is made smooth and the rising portion of the edge is made sharp.

However, as described above, this is accompanied by the problem of requiring a great amount of time if both the sloped portion and edge of the blaze and the edge—the entire blaze—are formed using a small-diameter beam.

In order to get a smooth sloped portion of the blaze, it is necessary in practice to use a large-diagram beam. By contrast, a small-diameter beam must be used to get a sharp rising portion of the blaze edge. The prior art, however, has failed to get a smooth sloped portion of the blaze and a sharp rising portion of the blaze edge and to reduce the overall blaze patterning time, at the same time.

SUMMARY OF THE INVENTION

To overcome the abovementioned drawbacks in conventional electron beam depicting methods and apparatus, it is an object of the present invention to provide electron beam depicting method and apparatus capable of getting a smooth sloped portion of the blaze and a sharp rising portion of the blaze edge using a small-diameter beam, and reducing the overall blaze patterning time, at the same time.

Accordingly, to overcome the cited shortcomings, the abovementioned object of the present invention can be attained by electron beam depicting methods and apparatus described as follow.

(1) An electron beam depicting method for depicting a predetermined pattern on a substrate, comprising the steps of: acquiring shape data of the predetermined pattern; generating a first input signal for deflecting an electron beam emitted from an electron gun in a main-scanning direction, and a second input signal for deflecting the electron beam emitted from the electron gun in a sub-scanning direction, based on the shape data of the predetermined pattern; adjusting an alternating bias signal, having a specific frequency, according to the shape data of the predetermined pattern; superposing the alternating bias signal on the second input signal; and deflecting the electron beam emitted from the electron gun in the sub-scanning direction according to the second input signal on which the alternating bias signal is superposed, while scanning the electron beam emitted from the electron gun by deflecting it in a main-scanning direction.

(2) The electron beam depicting method of item 1, wherein an amplitude of the alternating bias signal is adjusted in response to the shape data of the predetermined pattern in the adjusting step.

(3) The electron beam depicting method of item 1, wherein a structure of the predetermined pattern includes a plurality of edge portions.

(4) The electron beam depicting method of item 1, wherein the predetermined pattern is a diffraction structure constituted by a plurality of blazed diffraction gratings; and wherein the alternating bias signal is adjusted corresponding to a sloped area and an edge portion of each of the blazed diffraction gratings in the adjusting step.

(5) The electron beam depicting method of item 4, wherein an amplitude of the alternating bias signal is adjusted to a first amplitude value in a vicinity of the edge portion, while the amplitude of the alternating bias signal is adjusted to a second amplitude value in a vicinity of a center of the sloped area; and wherein the first amplitude value is smaller than the second amplitude value.

(6) The electron beam depicting method of item 1, further comprising the step of; controlling a scanning pitch in the sub-scanning direction of the electron beam in response to an amplitude of the alternating bias signal.

(7) The electron beam depicting method of item 1, wherein a depicted surface of the substrate is a curved surface.

(8) A method for manufacturing a mother die of a metallic mold utilized for molding an optical element, comprising the steps of: forming a resist film on a substrate; acquiring shape data of a predetermined pattern; generating a first input signal for deflecting an electron beam emitted from an electron gun in a main-scanning direction, and a second input signal for deflecting the electron beam emitted from the electron gun in a sub-scanning direction, based on the shape data of the predetermined pattern; adjusting an alternating bias signal, having a specific frequency, according to the shape data of the predetermined pattern; superposing the alternating bias signal on the second input signal; scanning the electron beam emitted from the electron gun by deflecting it in a main-scanning direction, while scanning the electron beam, emitted from the electron gun, by deflecting it in the sub-scanning direction according to the second input signal on which the alternating bias signal is superposed, so that the electron beam irradiated onto the substrate depicts the predetermined pattern; and developing the resist film on the substrate depicted in the scanning step, so as to acquire the mother die having a predetermined structure.

(9) The method of item 8, further comprising the step of: etching the substrate developed in the developing step.

(10) A mother die of a metallic mold utilized for molding an optical element, the mother die being manufactured by a method comprising the steps of: forming a resist film on a substrate; acquiring shape data of a predetermined pattern; generating a first input signal for deflecting an electron beam emitted from an electron gun in a main-scanning direction, and a second input signal for deflecting the electron beam emitted from the electron gun in a sub-scanning direction, based on the shape data of the predetermined pattern; adjusting an alternating bias signal, having a specific frequency, according to the shape data of the predetermined pattern; superposing the alternating bias signal on the second input signal; scanning the electron beam emitted from the electron gun by deflecting it in a main-scanning direction, while scanning the electron beam, emitted from the electron gun, by deflecting it in the sub-scanning direction according to the second input signal on which the alternating bias signal is superposed, so that the electron beam irradiated onto the substrate depicts the predetermined pattern; and developing the resist film on the substrate depicted in the scanning step, so as to acquire the mother die having a predetermined structure.

(11) The mother die of item 10, the method further comprising the step of: etching the substrate developed in the developing step.

(12) A method for manufacturing metallic mold utilized for molding an optical element, comprising the steps of: forming a resist film on a substrate; acquiring shape data of a predetermined pattern; generating a first input signal for deflecting an electron beam emitted from an electron gun in a main-scanning direction, and a second input signal for deflecting the electron beam emitted from the electron gun in a sub-scanning direction, based on the shape data of the predetermined pattern; adjusting an alternating bias signal, having a specific frequency, according to the shape data of the predetermined pattern; superposing the alternating bias signal on the second input signal; scanning the electron beam emitted from the electron gun by deflecting it in a main-scanning direction, while scanning the electron beam, emitted from the electron gun, by deflecting it in the sub-scanning direction according to the second input signal on which the alternating bias signal is superposed, so that the electron beam irradiated onto the substrate depicts the predetermined pattern; developing the resist film on the substrate depicted in the scanning step, so as to acquire a mother die having a predetermined structure; and applying an electroforming processing to the mother die having the resist film developed in the developing step, so as to form the metallic mold on which the predetermined structure is transferred.

(13) The method of item 12, further comprising the step of: etching the substrate developed in the developing step.

(14) A metallic mold utilized for molding an optical element, the metallic mold being manufactured by a method comprising the steps of: forming a resist film on a substrate; acquiring shape data of a predetermined pattern; generating a first input signal for deflecting an electron beam emitted from an electron gun in a main-scanning direction, and a second input signal for deflecting the electron beam emitted from the electron gun in a sub-scanning direction, based on the shape data of the predetermined pattern; adjusting an alternating bias signal, having a specific frequency, according to the shape data of the predetermined pattern; superposing the alternating bias signal on the second input signal; scanning the electron beam emitted from the electron gun by deflecting it in a main-scanning direction, while scanning the electron beam, emitted from the electron gun, by deflecting it in the sub-scanning direction according to the second input signal on which the alternating bias signal is superposed, so that the electron beam irradiated onto the substrate depicts the predetermined pattern; developing the resist film on the substrate depicted in the scanning step, so as to acquire a mother die having a predetermined structure; and applying an electroforming processing to the mother die having the resist film developed in the developing step, so as to form the metallic mold on which the predetermined structure is transferred.

(15) The metallic mold of item 14, the method further comprising the step of: etching the substrate developed in the developing step.

(16) A method for manufacturing an optical element, comprising the steps of: forming a resist film on a substrate; acquiring shape data of a predetermined pattern; generating a first input signal for deflecting an electron beam emitted from an electron gun in a main-scanning direction, and a second input signal for deflecting the electron beam emitted from the electron gun in a sub-scanning direction, based on the shape data of the predetermined pattern; adjusting an alternating bias signal, having a specific frequency, according to the shape data of the predetermined pattern; superposing the alternating bias signal on the second input signal; scanning the electron beam emitted from the electron gun by deflecting it in a main-scanning direction, while scanning the electron beam, emitted from the electron gun, by deflecting it in the sub-scanning direction according to the second input signal on which the alternating bias signal is superposed, so that the electron beam irradiated onto the substrate depicts the predetermined pattern; developing the resist film on the substrate depicted in the scanning step, so as to acquire a mother die having a predetermined structure; applying an electroforming processing to the mother die having the resist film developed in the developing step, so as to form a metallic mold onto which the predetermined structure is transferred; and molding the optical element having the predetermined structure by means of the metallic mold.

(17) The method of item 16, further comprising the step of: etching the substrate developed in the developing step.

(18) An optical element manufactured by a method comprising the steps of: forming a resist film on a substrate; acquiring shape data of a predetermined pattern; generating a first input signal for deflecting an electron beam emitted from an electron gun in a main-scanning direction, and a second input signal for deflecting the electron beam emitted from the electron gun in a sub-scanning direction, based on the shape data of the predetermined pattern; adjusting an alternating bias signal, having a specific frequency, according to the shape data of the predetermined pattern; superposing the alternating bias signal on the second input-signal; scanning the electron beam emitted from the electron gun by deflecting it in a main-scanning direction, while scanning the electron beam, emitted from the electron gun, by deflecting it in the sub-scanning direction according to the second input signal on which the alternating bias signal is superposed, so that the electron beam irradiated onto the substrate depicts the predetermined pattern; developing the resist film on the substrate depicted in the scanning step, so as to acquire a mother die having a predetermined structure; applying an electroforming processing to the mother die having the resist film developed in the developing step, so as to form a metallic mold onto which the predetermined structure is transferred; and molding the optical element having the predetermined structure by means of the metallic mold.

(19) The optical element of item 18, the method further comprising the step of: etching the substrate developed in the developing step.

(20) An electron beam depicting apparatus for depicting a predetermined pattern on a substrate by irradiating an electron beam onto the substrate, comprising: an electron-beam irradiating section to irradiate the electron beam onto the substrate; an electron-beam deflecting section to deflect the electron beam irradiated from the electron-beam irradiating section; a storage section to store shape data of the predetermined pattern; and a controlling section to control the electron-beam irradiating section and the electron-beam deflecting section, based on the shape data of the predetermined pattern stored in the storage section; wherein the controlling section includes: a first-signal generating circuit to generate a first signal for deflecting the electron beam in a main-scanning direction; a second-signal generating circuit to generate a second signal for deflecting the electron beam in a sub-scanning direction; an alternating-bias signal adjusting circuit to adjust an alternating bias signal having a specific frequency; and an alternating-bias signal superposing circuit to superpose the alternating bias signal on the second signal.

(21) The electron beam depicting apparatus of item 20, wherein the shape data of the predetermined pattern, stored in the storage section, include dose distributing information, which are defined as dose distributions corresponding to each of scanning positions on the substrate.

(22) The electron beam depicting apparatus of item 20, wherein the alternating-bias signal adjusting circuit adjusts an amplitude of the alternating bias signal in response to the shape data of the predetermined pattern.

(23) The electron beam depicting apparatus of item 22, wherein the predetermined pattern is a diffraction structure constituted by a plurality of blazed diffraction gratings; and wherein the alternating-bias signal adjusting circuit adjusts the alternating bias signal so that the amplitude of the alternating bias signal varies corresponding to a sloped area and an edge portion of each of the blazed diffraction gratings.

(24) The electron beam depicting apparatus of item 23, wherein the alternating-bias signal adjusting circuit adjusts the amplitude of the alternating bias signal to a first amplitude value in a vicinity of the edge portion, while the alternating-bias signal adjusting circuit adjusts the amplitude of the alternating bias signal to a second amplitude value in a vicinity of a center of the sloped area; and wherein the first amplitude value is smaller than the second amplitude value.

(25) The electron beam depicting apparatus of item 24, wherein the controlling section also adjusts a deflection pitch, with which the electron beam is deflected in the sub-scanning direction according to the second signal, corresponding to the amplitude of the alternating bias signal adjusted by the alternating-bias signal adjusting circuit.

Further, to overcome the abovementioned problems, other electron beam depicting methods, embodied in the present invention, will be described as follow:

(26) An electron beam depicting method, characterized in that, in the electron beam depicting method for depicting a predetermined pattern on a base material, by scanning an electron beam in a main-scanning direction onto the base material being an object under depicting and by repeating the main-scanning operation in a sub-scanning direction, the method includes:

an acquiring step for acquiring shape data of the predetermined pattern;

a signal generating step for generating a first input signal for deflecting an emitted electron beam in the main-scanning direction, and a second input signal for deflecting the emitted electron beam in a sub-scanning direction, based on the shape data of the predetermined pattern;

a frequency adjusting step for adjusting an frequency signal, having a specific frequency and serving as an alternating bias signal, according to the shape data of the predetermined pattern;

a superposing step for superposing the frequency signal on the second input signal;

a scanning step for scanning the emitted electron beam in the main-scanning direction by deflecting it according to the first input signal, and scanning the emitted electron beam in the sub-scanning direction by deflecting it according to the second input signal.

(27) The electron beam depicting method, described in item 26, characterized in that an amplitude of the frequency signal is adjusted in response to the shape data of the predetermined pattern

(28) The electron beam depicting method, described in item 26 or 27, characterized in that a structure of the predetermined pattern includes a plurality of edge portions.

(29) The electron beam depicting method, described in item 26 or 27, characterized in that the predetermined pattern is a diffraction structure constituted by a plurality of blazed diffraction gratings; and the frequency signal is adjusted corresponding to a sloped area and an edge portion of each of the blazed diffraction gratings.

(30) The electron beam depicting method, described in item 29, characterized in that the amplitude of the frequency signal is adjusted to a small value in respect to a vicinity of the edge portion, compared to that at a center of the sloped area.

(31) The electron beam depicting method, described in anyone of items 27-29, characterized in that the method further includes:

a scanning pitch adjusting step for adjusting a scanning pitch in respect to the sub-scanning direction of said electron beam.

(32) The electron beam depicting method, described in anyone of items 26-31, characterized in that a surface of the base material, being the object under depicting, has a curved surface.

(33) A manufacturing method of a mother die, characterized in that, in the manufacturing method of the mother die for manufacturing the mother die of a metallic mold utilized for molding an optical element by using the base material depicted by means of the electron beam depicting method described in anyone of items 26-32, the method includes:

a resist film forming step for forming a resist film on the base material before depicting on the base material;

a developing step for developing the depicted resist film on the base material, so as to acquire the mother die having a predetermined structure.

(34) The manufacturing method of a mother die, described in item 33, characterized in that the method further includes:

an etching step for applying an etching processing to the base material developed in the developing step.

(35) A mother die, characterized in that the mother die is manufactured by the manufacturing method of the mother die, described in item 33 or 34.

(36) A manufacturing method of a metallic mold, characterized in that the method includes:
an electroforming step for conducting electroforming processing by using the mother die described in item 35 to acquire the metallic mold onto which the predetermined structure on the mother die is transferred.
(37) A metallic mold, characterized in that
the metallic mold is manufactured by the manufacturing method of the metallic mold, described in item 36.
(38) An optical element, characterized in that
the optical element is molded by the metallic mold, described in item 37.

BRIEF DESCRIPTION OF THE DRAWINGS

Other objects and advantages of the present invention will become apparent upon reading the following detailed description and upon reference to the drawings in which:

FIG. 4 is an explanatory drawing for explaining a measuring principle of a measuring device equipped in an electron beam depicting apparatus;

FIG. 5(A), FIG. 5(B) and FIG. 5(C) are explanatory drawings for explaining a method for measuring a surface height of the substrate;

DETAILED DESCRIPTION OF THE PREFERRED EMBODIMENT

Figure 1:
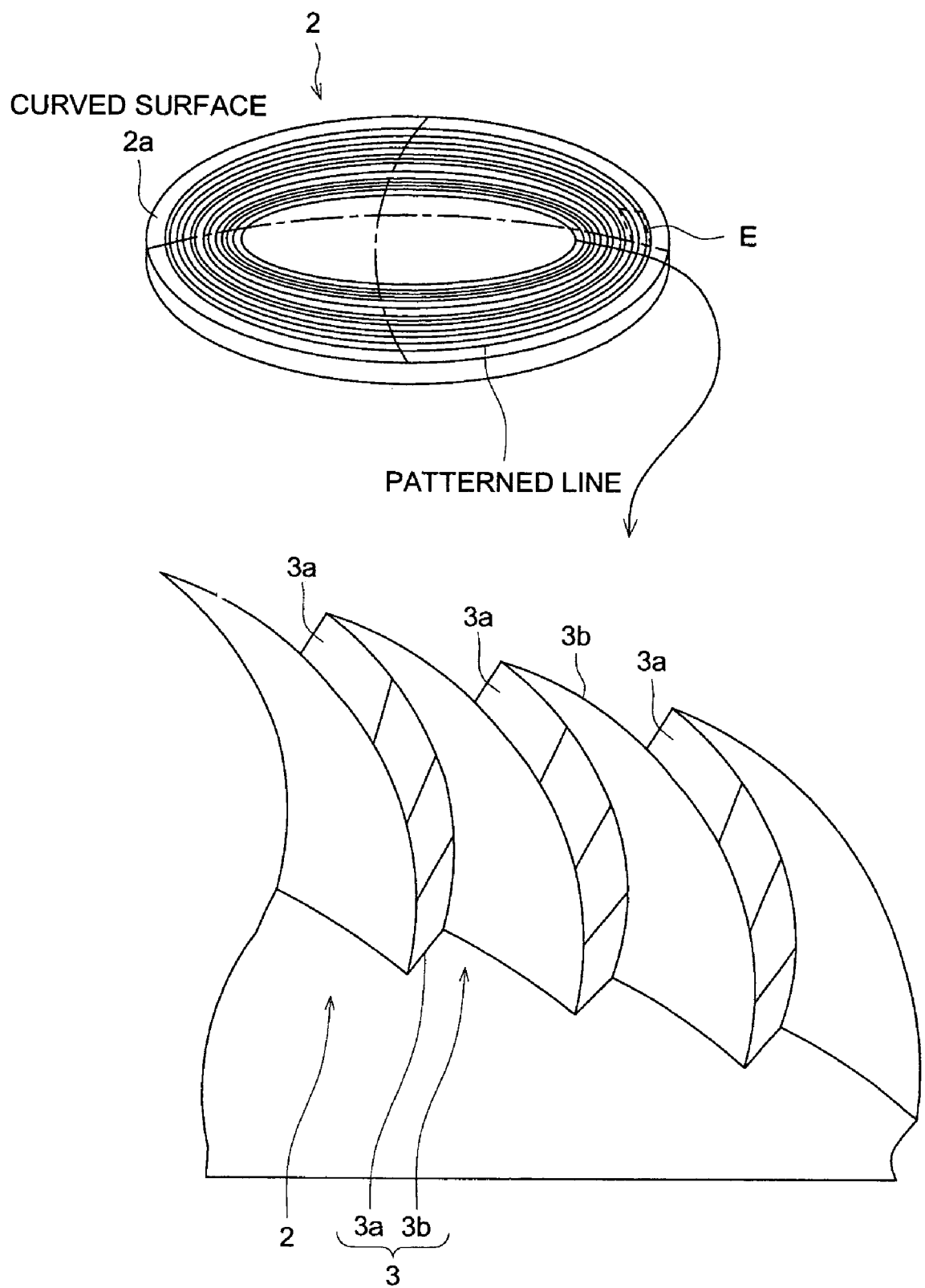
FIG. 1 is a drawing representing the pattern formed on the one side of this substrate and its detailed configuration subsequent to its development.

Referring to the drawings, the preferred embodiments of an electron beam depicting method embodied in the present invention will be detailed in the following.

[Configuration of Substrate]

In the first place, the following shows the configuration of the substrate to be formed by the electron beam depicting apparatus: The following description of the present embodiment will take examples of the cases where a diffraction structure of blaze shape is formed while a circle is formed on one surface of the substrate having a curved surface. It should be noted that the present invention is not restricted thereto; the surface of the substrate can be a plane surface.

FIG. 1 is a drawing representing the pattern formed on the one side of this substrate and its detailed configuration subsequent to its development. As shown in FIG. 1, a circle is formed on one side of the substrate 2 as an example of the pattern. When the portion E as part of the formed portion is enlarged, it can be seen that a diffraction structure made up of a plurality of blazes 3 is formed. The blaze 3 makes up a slope 3b (sloped surface) and side wall 3a (edge). The slope 3b is created in a curved surface circumferentially in a plurality of steps.

Figure 2:
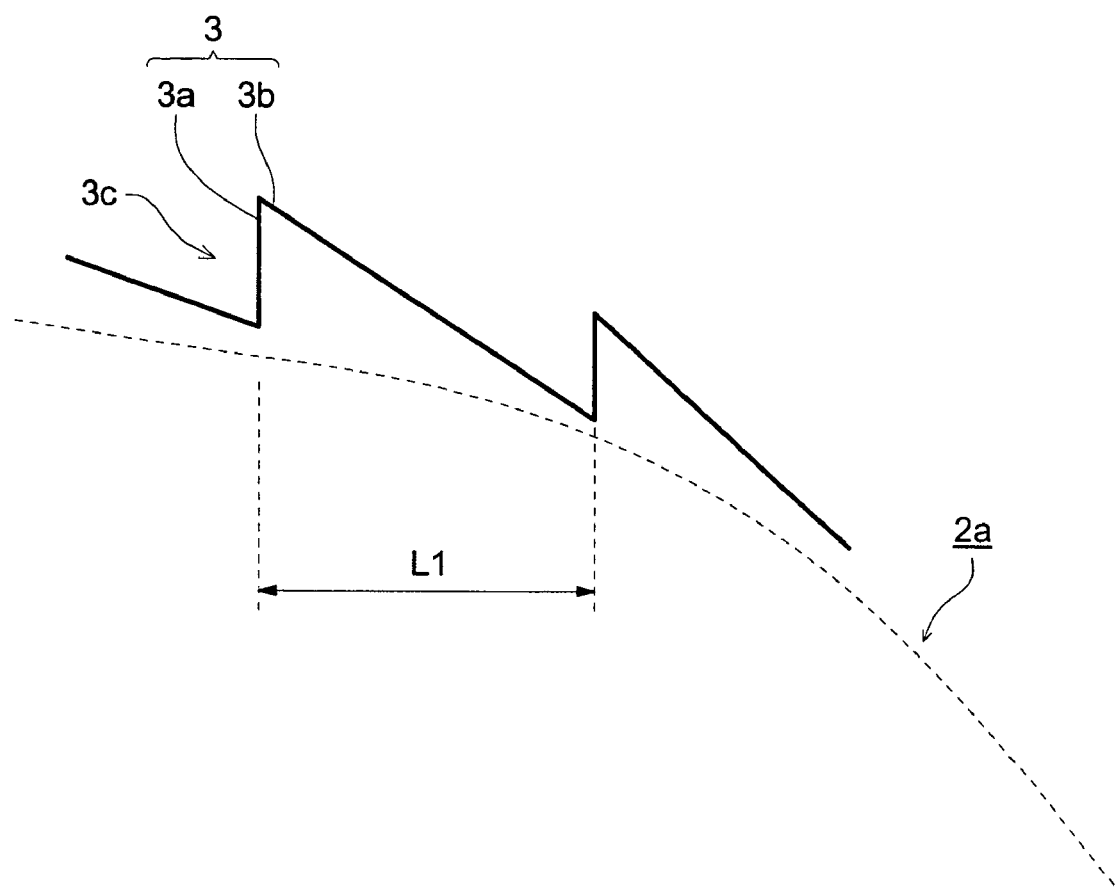
FIG. 2 is an explanatory drawing for explaining the detail of a main part of the substrate shown in FIG. 1.

To put it in greater details, the substrate 2 has a curved surface 2a created on at least one surface, as shown in FIG. 2, and a diffraction grating is tilted to form a blaze for each pitch L1. A side wall 3a rising from the curved surface 2a at the position separating between two pitches, a slope 3b created between adjacent side walls 3a, and a groove 3c formed in the boundary between the side wall 3a and slope 3b are formed for at least one pitch of this diffraction grating.

The slope 3b is configured in such a way that one end is in contact with the base of one end of the side wall 3a and the other end with that of the other end of the side wall 3a. As will be described later, the diffraction grating comprising a plurality of blazes 3 is formed by the step of exposing a coating agent (a resist) applied to the curved surface 2a through an electron beam depicting apparatus, and the step of development. The slope 3b of the blaze 3 is provided with a smooth slope through exposure by the electron beam depicting apparatus to be described later. The side wall 3a and groove 3c, namely the edge, are provided with a sharp rising configuration through exposure by the electron beam depicting apparatus.

[Configuration of an Electron Beam Depicting Apparatus]

Figure 3:
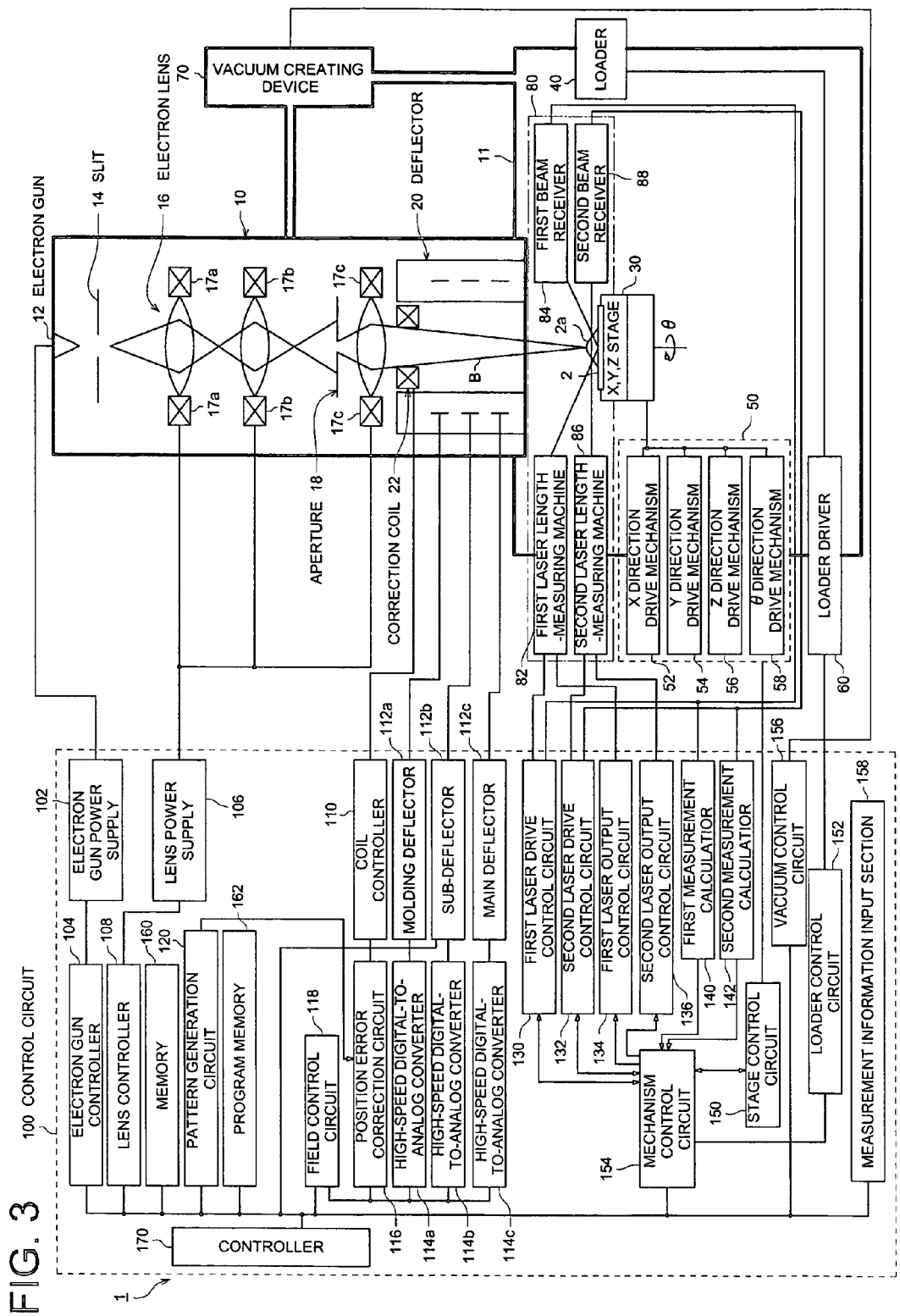
FIG. 3 is a drawing representing the overall configuration of an electron beam depicting apparatus.

The following describes the specific configuration of the electron beam depicting apparatus used for patterning of the aforementioned substrate:

FIG. 3 is a drawing representing the overall configuration of an electron beam depicting apparatus. As shown in FIG. 3, in the electron beam depicting apparatus 1, a large-current, high-resolution electron beam probe is formed and is operated to scan the substrate 2 as an exposure target at a high speed. The electron beam depicting apparatus 1 includes: an electron gun 12 as an electron beam application means for forming a high-resolution electron beam probe, generating en electronic beam and applying beams to the target; a slit 14 for allowing the electron beam from this electron gun 12 to pass through; an electron lens 16 for controlling the focal position of the electron beam passing through the slit 14 with respect to the substrate 2; an aperture 18 arranged along the path for outgoing electron beam; a deflector 20 for controlling the scan position on the substrate 2 as a target by deflecting the electron beam; and a correction coil 22 for correcting deflection. These components are arranged in a lens barrel 10 and are kept in a vacuum state when the electron beam is applied.

Further, the electron beam depicting apparatus 1 includes; a X-Y-Z stage 30 for mounting the substrate as an exposure target; a loader 40 as a transport means for transporting the substrate 2 to the mounting position on this X-Y-Z stage 30; a measuring apparatus 30 as a measuring means for measuring the reference point on the surface of the substrate 2 on the X-Y-Z stage 30; a stage drive device 50 as a drive means for driving the X-Y-Z stage 30; a stage driver 50 as a drive means for driving the loader; a vacuum creating device 70 for creating a vacuum in the lens barrel 10 and enclosure 11 through evacuation; and a control circuit 100 as a control means for controlling the above.

The electron lens 16 is designed in such a way that a plurality of electronic lenses are generated by supplying electric current to the coils 17a, 17b and 17c arranged apart from one another at several places along the height, and the focal position and width (width of beam waste) of the electron beam are adjusted by controlling the aforementioned current value.

The measuring device 80 includes: a first laser length-measuring machine 82 for measuring the substrate 2 by applying laser to the substrate 2; a first beam receiver 84 for receiving the laser beam (first applied beam) emitted from the first laser length-measuring machine 82 when it has hit the substrate 2 and is reflected thereby; a second laser length-measuring machine 86 where the beam is applied from the angle different from that for the aforementioned first laser length-measuring machine 82; and a second beam receiver 88 for receiving the laser beam (second applied light) emitted by the aforementioned second laser length-measuring machine 86 when it has hit the substrate 2 and is reflected thereby.

The stage drive device 50 includes: an X direction drive mechanism 52 for driving the X-Y-Z stage 30 in the X direction; a Y direction drive mechanism 54 for driving the X-Y-Z stage 30 in the Y direction; a Z direction drive mechanism 56 for driving the X-Y-Z stage 30 in the Z direction; and a θ direction drive mechanism 58 for driving the X-Y-Z stage 30 in the θ direction. It is also possible to make such arrangements that an α direction drive mechanism capable of rotation in the α direction about the Y axis, and a γ direction drive mechanism capable of rotation in the γ direction about the X axis are provided in addition to the aforementioned ones, to ensure that pitching, yoking and rolling of the stage can be performed. This arrangement allows the X-Y-Z stage 30 to be moved in three dimensions and permits alignment to be performed.

The control circuit 100 includes: an electron gun power supply 102 for supply electric power to the electron gun 12; an electron gun controller 104 for regulating and controlling the current and voltage of the electron gun power supply 102; a lens power supply 106 for driving the electron lens 16 (each of a plurality of electronic lens); and a lens controller 108 for regulating and controlling the current corresponding to each electron lens at the lens power supply 106. The electron gun power supply 102 has a digital-to-analog converter (not illustrated) for supply power to the electron gun 12. The dose of the electron beam applied from the electron gun 12 can be regulated by the electron gun controller 104 regulating and controlling the current and voltage of the digital-to-analog converter (not illustrated). Thus, the dose of the minimum regulation unit of the electron beam depicting apparatus is determined by the minimum clock of this digital-to-analog converter.

The control circuit 100 further includes: a coil controller 110 for controlling the correction coil 22; a molding deflector 112a for carrying out deflection in the molding direction by the deflector 20; a sub-deflector 112b for carrying out deflection in the sub-scanning direction by the deflector 20; a main deflector 112c for carrying out deflection in the main scanning direction by the deflector 20; a high-speed digital-to-analog converter 114a for converting a digital signal from digital to analog signal to control the molding deflector 112a; a high-speed digital-to-analog converter 114b for converting a digital signal from digital to analog signal to control the sub-deflector 112b; molding deflector 112a; and a high-precision digital-to-analog converter 114c for converting a digital signal from digital to analog signal to control the main deflector 112c.

The control circuit 100 further includes: a position error correction circuit 116 for correcting the positional error in the deflector 20, i.e. promoting correction of the positional error by supplying a position error correction signal to the high-speed digital-to-analog converters 114a and 114b and high-precision digital-to-analog converter 114c or correcting the positional error through the correction coil 22 by supplying the aforementioned signal to the coil controller 110; a field control circuit 118 for controlling the electron beam field by controlling the high-speed digital-to-analog converters 114a and 114b and high-precision digital-to-analog converter 114c; and a pattern generation circuit 120 for forming the pattern on the substrate 2. Incidentally, the pattern generation circuit 120 generates a predetermined pattern according to the information on the various pattern configurations loaded in the memory 160. This arrangement allows the data on the predetermined pattern to be acquired.

The control circuit 100 further includes: a first laser drive control circuit 130 for controlling the travel of the laser application position by vertical and horizontal travel of the first laser length-measuring machine 82 and the drive of the angles such as laser application angle; a second laser drive control circuit 132 for controlling the travel of the laser application position by vertical and horizontal travel of the second laser length-measuring machine 86 and the drive of the angles such as laser application angle; a first laser output control circuit 134 for regulating and controlling the output of the laser beam (laser beam intensity) by the first laser length-measuring machine 82; a second laser output control circuit 136 for regulating and controlling the output of the laser beam by the second laser length-measuring machine 86; a first measurement calculator 140 for calculating the result of measurements base on the reception by the first beam receiver 84; and a second measurement calculator 142 for calculating the result of measurements based on the reception by the second beam receiver 88.

The control circuit 100 further includes: a stage control circuit 150 for controlling the stage drive device 50; a loader control circuit 152 for controlling a loader driver 60; a mechanism control circuit 154 for controlling the first laser drive control circuits 130 and 132, the second laser output control circuits 134 and 136, the first and second measurement calculators 140 and 142, the stage control circuit 150, and the loader control circuit 152; a vacuum control circuit 156 for controlling the vacuum creation and evacuation of the vacuum creating device 70; a measurement information input section 158 for inputting the measurement information; a memory 160 as a memory means for storing the inputted information and other multiple information items; a program memory 162 for memorizing the control program for various type of controls; and a controller 170, created, for example, by the CPU, for controlling the aforementioned items.

The electron beam depicting apparatus 1 is designed in such a way that various types of command operations such as analog/digital mode selection and selection from a plurality of the patterns of basic configuration can be performed in the so-called "operation system" or "operation means" including the measurement information input section 158.

In the electron beam depicting apparatus 1 configured in the aforementioned arrangement, when the substrate 2 carried by the loader 40 is mounted on the X-Y-Z stage 30, electron beam is irradiated from the electron gun 12 after air and dust in the lens barrel 10 and enclosure 11 is removed by the vacuum creating device 70.

The electron beam applied from the electron gun 12 is deflected by the deflector 20 through the electron lens 16. The deflected electron beam B (hereinafter the electron beam having passed through the electron lens 16 may be referred to as "electron beam B") is applied to the surface of the substrate 2 on the X-Y-Z stage 30, for example, the patterning position on the curved surface 2a (curve), whereby patterning is carried out.

In this case, the patterning position (at least the position along the height out of the patterning positions on the substrate 2) or the position of the reference point to be described later is measured by the measuring device 80. The control circuit 100 regulates and controls the current values flowing through the coils 17a, 17b and 17c of the electron lens 16 according to the result of measurement, thereby controlling the position of the focal depth of the electron beam B, i.e. the focal position, and traveling control is provided so that the focal position will be the aforementioned patterning position.

Based on the result of measurement, the control circuit 100 controls the stage drive device 50, thereby moving the X-Y-Z stage 30 in such a way that the focal position of the electron beam B will be the aforementioned patterning position.

Control of electron beam and/or X-Y-Z stage 30 may be employed in this example.

(Measuring Device) The following describes the measuring device 80 with reference to FIG. 4: To put it in greater details, the measuring device 80 contains the first laser length-measuring machine 82, first beam receiver 84, second laser length-measuring machine 86 and second beam receiver 88, as shown in FIG. 4.

The first light beam S1 is applied to the substrate 2 from the direction crossing the electron beam by the first laser length-measuring machine 82. The first light intensity distribution is detected by reception of the first light beam S1 passing through the substrate 2.

In this case, as shown in FIG. 4, the first light beam S1 is reflected by the flat portion 2b of the substrate 2, and therefore the position on the flat portion 2b of the substrate 2 (height) can be measured and calculated according to the first beam strength distribution. In this case, however, the position on the curved surface 2a of the substrate 2 (height) can be measured and calculated.

In this example, the second laser length-measuring machine 86 is further provided. In other words, the second light beam S2 is applied to the substrate 2 from the direction approximately orthogonal to the electron beam different from the first light beam S1 by the second laser length-measuring machine 86. The second light beam S2 passing through the substrate 2 is received by the pin hole 84 contained in the second beam receiver 88, whereby the second beam strength distribution is detected.

In this case, as shown in FIG. 5(A), FIG. 5(B) and FIG. 5(C), the second light beam S2 passes over the curved surface 2a and therefore the position on the curved surface 2a protruding from the flat portion 2b of the substrate 2 (height) is measured and calculated according to the second beam strength distribution.

To put it more specifically, when the second light beam S2 has passed through the specific height of the position (x, y) on the curved surface 2a in the X-Y reference coordinate system, the second light beam S2 hits the curve of the curved surface 2a, as shown in FIG. 5(A), FIG. 5(B) and FIG. 5(C), at this position (x, y), whereby scattered light SS1 and SS2 are produced, with the result that the intensity of this scatter light is reduced. In this manner, as shown in FIG. 6, the position is measured and calculated according to the second beam intensity distribution detected by the second beam receiver 88.

Figure 6:
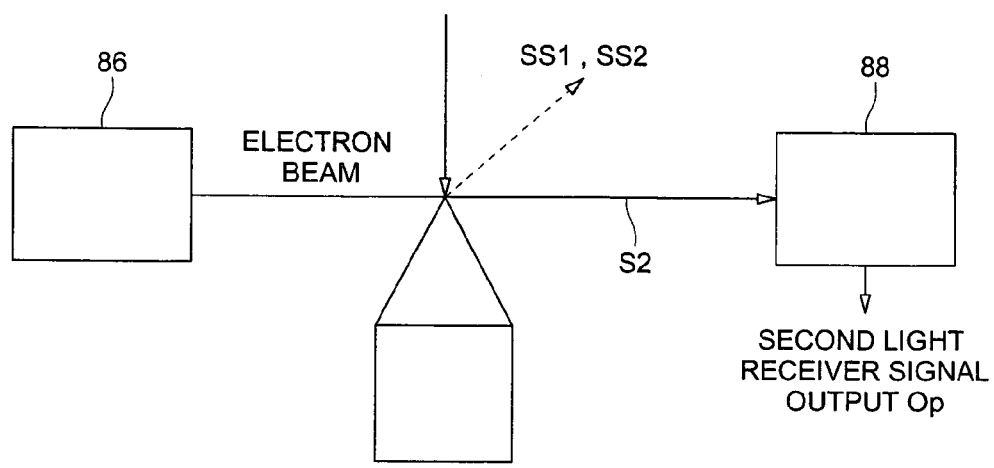
FIG. 6 is an explanatory drawing for explaining a relationship between a light emission and a light reception of a measuring device equipped in an electron beam depicting apparatus shown in FIG. 1.
Figure 7:
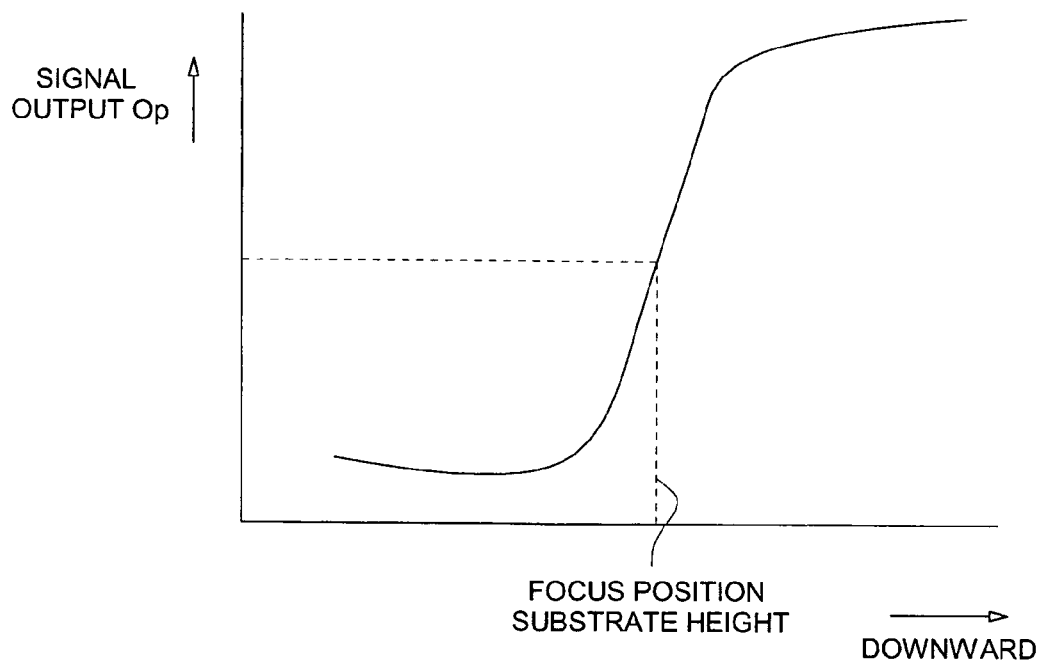
FIG. 7 is a characteristic graph showing a relationship between a height of the substrate and output signals from a light receiving section of a measuring device.

In this calculation, as shown in FIG. 6, the signal output Op of the second beam receiver 88 has a correlation between the signal output Op and substrate height as shown in the characteristic chart given in FIG. 7, and therefore this characteristic, i.e. the correlation table showing the relation of correlation is stored in the memory 160 of the control circuit 100 in advance, whereby the height position of the substrate can be calculated according to the signal output Op in the second beam receiver 88.

Thus, the focal position of the aforementioned beam is adjusted using this height position of the substrate as a position to be patterned, and patterning is carried out.

(Overview of the Principle for Calculating the Patterning Position)

Figure 8:
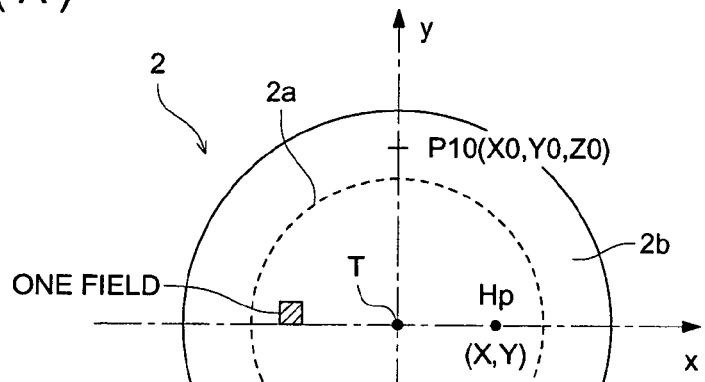
FIG. 8(A) and FIG. 8(B) are explanatory drawings showing the substrate to be depicted by an electron beam depicting apparatus shown in FIG. 1.
FIG. 8(C) is an explanatory drawing for explaining a depicting principle of it.
Figure 8:
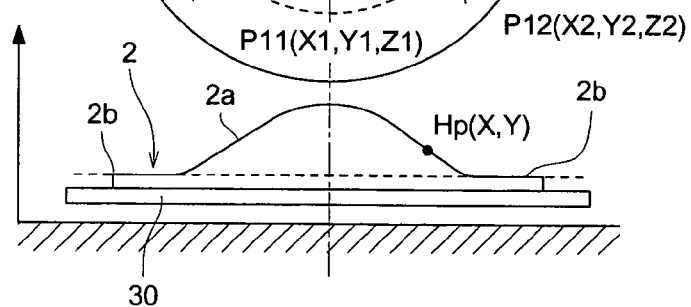
Figure 8:
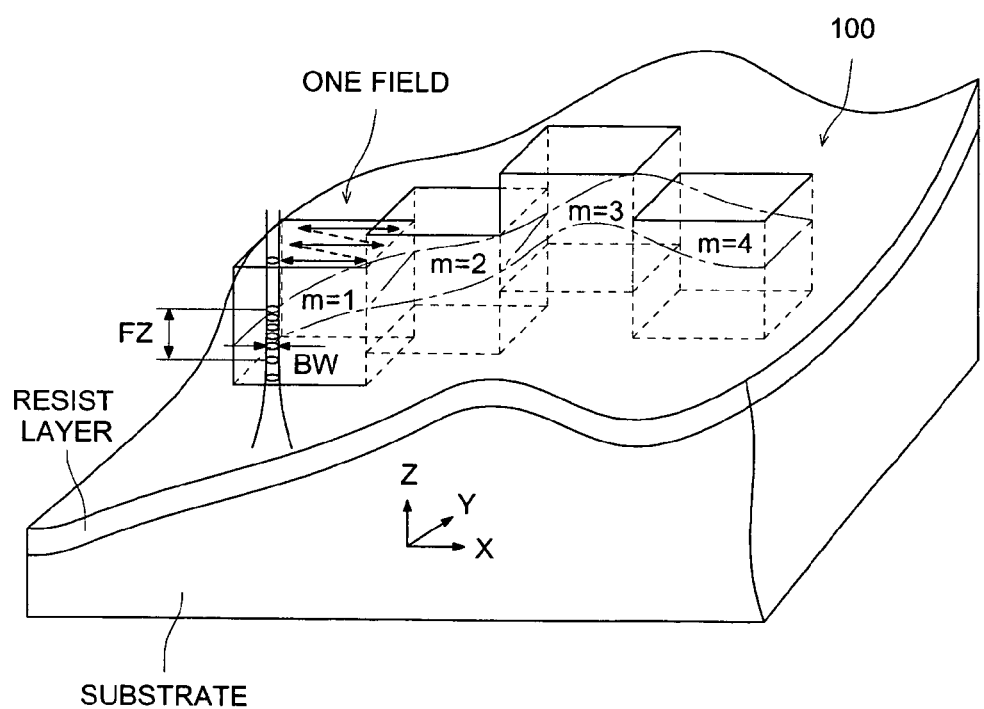

The following outlines the principle for calculating the patterning position when patterning is carrying out:

As shown in FIG. 8(A) and FIG. 8(B), the substrate 2 is preferred to be formed by the optical element such as an optical lens. It comprises the flat portion 2b having a cross section of approximately planar surface and the curved surface 2a protruding from the flat portion 2b. The curve of this curved surface 2a is not limited to the spherical surface; it can be a free curved surface that varies in all directions of height including a non-spherical surface.

In such a substrate 2, a plurality of reference points, e.g. three points P00, P01 and P02 on the substrate 2 are determined in advance, before the substrate 2 is mounted on the X-Y-Z stage 30, and these positions are measured (first measurement). This arrangement allows the X axis to be defined by the reference points P00 and P01, and Y axis by the reference points P00 and P02, whereby the first reference coordinate system in the 3-D coordinate system is calculated. Here the height position in the first refrigerator coordinate system is assumed as Ho (x, y) (first height position). This arrangement allows the thickness of the substrate 2 to be calculated.

After the substrate 2 has been mounted on the X-Y-Z stage 30, the same steps are taken. To put it another way, as shown in FIG. 8(A), a plurality of reference points, e.g. three points P10, P11 and P12 on the substrate 2 are determined in advance, and these positions are measured (second measurement). This arrangement allows the X axis to be defined by the reference points P10 and P11, and Y axis by the reference points P10 and P12, whereby the second reference coordinate system in the 3-D coordinate system is calculated.

Using the reference points P00, P01, P02, P10, P11 and P12, a coordinate conversion matrix or the like for converting the first reference coordinate system into the second one is calculated. This coordinate conversion matrix is employed to calculate the height position Hp (x, y) (second height position) corresponding to the aforementioned Ho (x, y) in the second reference coordinate system. Using this position as the optimum focus position, i.e. position to be patterned, the focal position of electron beam is adjusted. This arrangement allows the thickness distribution of the aforementioned substrate 2 to be corrected.

The aforementioned second measurement can be made by the measuring device 80 as a first measuring means of the electron beam depicting apparatus 1.

The first measurement must be measured by another measuring device in a separate position. Such a measuring device for measuring the reference point in advance before the substrate 2 is mounted on the substrate 2 includes the measuring device (second measuring means) having exactly the same configuration as that of the aforementioned measuring device 80, and this can be adopted.

In this case, the result of measurement by the measuring device is inputted, for example, by a measurement information input section 158 shown in FIG. 3, or is transferred as data through the network (not illustrated) connected to the control circuit 100 and is stored in the memory 160. Needless to say, this measuring device may not be necessary.

In the manner described above, the position to be patterned is calculated and the focal position of electron beam is controlled, whereby patterning is carried out.

Figure 9:
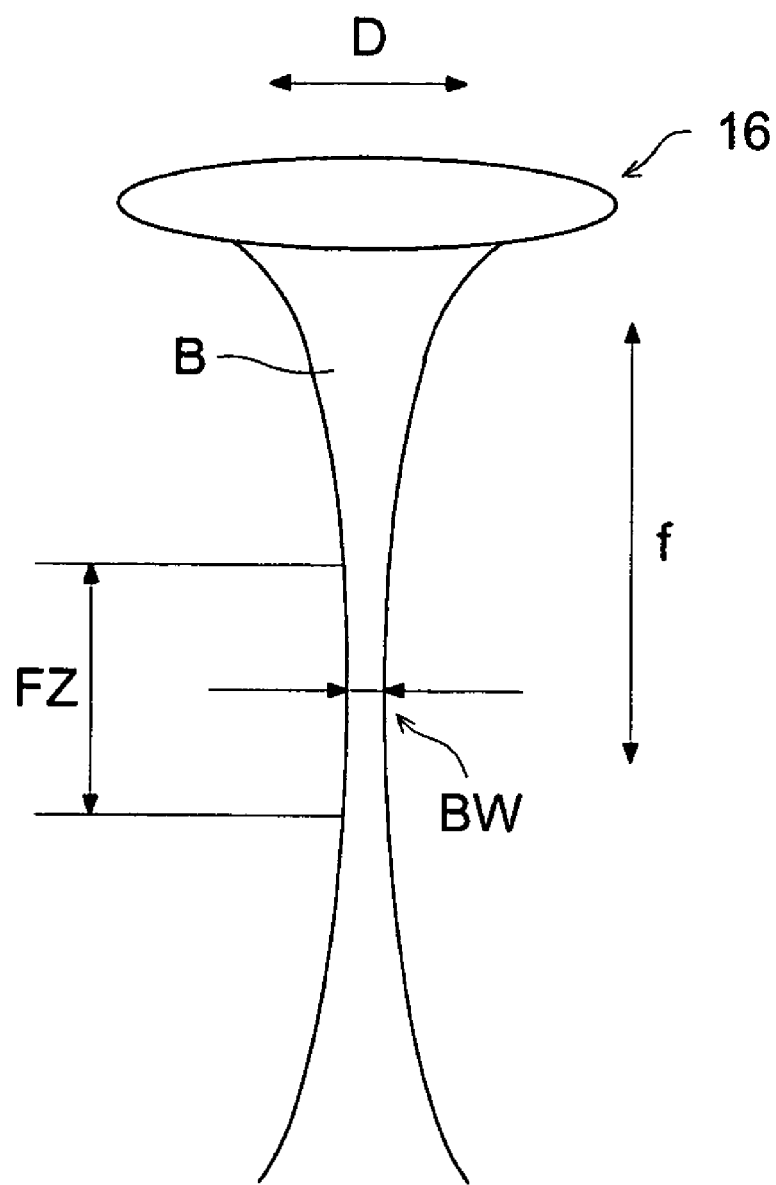
FIG. 9 is an explanatory drawing for explaining a beam-waist of an electron beam.

To put it more specifically, as shown in FIG. 8(C), the focal position of the focal depth FZ of electron beam (beam waist BW=position of the smallest beam diameter) is adjusted and controlled to the position to be patterned in one field (m=1) of the unit space in the 3-D coordinate system. (This control, as described above, is performed by the adjustment of the current value by the electron lens 16 and/or the drive control of the X-Y-Z stage 30). In this example, the field is set in such a way that height of one field is longer than the focal depth FZ, without the present invention being restricted thereto. Here the focal depth FZ denotes the height of the range where the beam waist BW is valid, in the electron beam B applied through the electron lens 16, as shown in FIG. 9. Incidentally, as described above, the width of the beam waist BW is adjusted by controlling the currents flowing through the coils 17a, 17b, 17c, etc. of the electron lens 16. In the case of the electron beam B, the D/f is about 0.01 assuming the width D of the electron lens 16 and depth f from the electron lens 16 to the beam waist BW, as shown in FIG. 9. For example, the resolution is about 50 nanometers and the focal depth is several tens of microns.

Referring to FIG. 8(C), patterning is carried out in one field when scanning in the X direction is carried out gradually while shifting in the Y direction within one field. If there is any area in one field where patterning is not performed, patterning is carried out by similar scanning for this area through movement in the Z direction under the control of the focal position as described above.

After patterning in one field, in other fields such as the field of m=2 or m=3 as well, processing of patterning is applied on a real-time basis while measurement and calculation of the position to be patterned are performed, in the same manner as above. When all patterning operations have been completed for all the areas to be patterned, processing of patterning on the surface of the substrate 2 terminates.

In this example, the area to be patterned is assumed as a layer to be patterned, and the portion corresponding to the curve of the curved surface 2a in this layer as a surface to be patterned.

The processing programs for handling various operations, measurements and controls as described above are loaded in the program memory 162 as control programs in advance.

(Control System)

Figure 10:
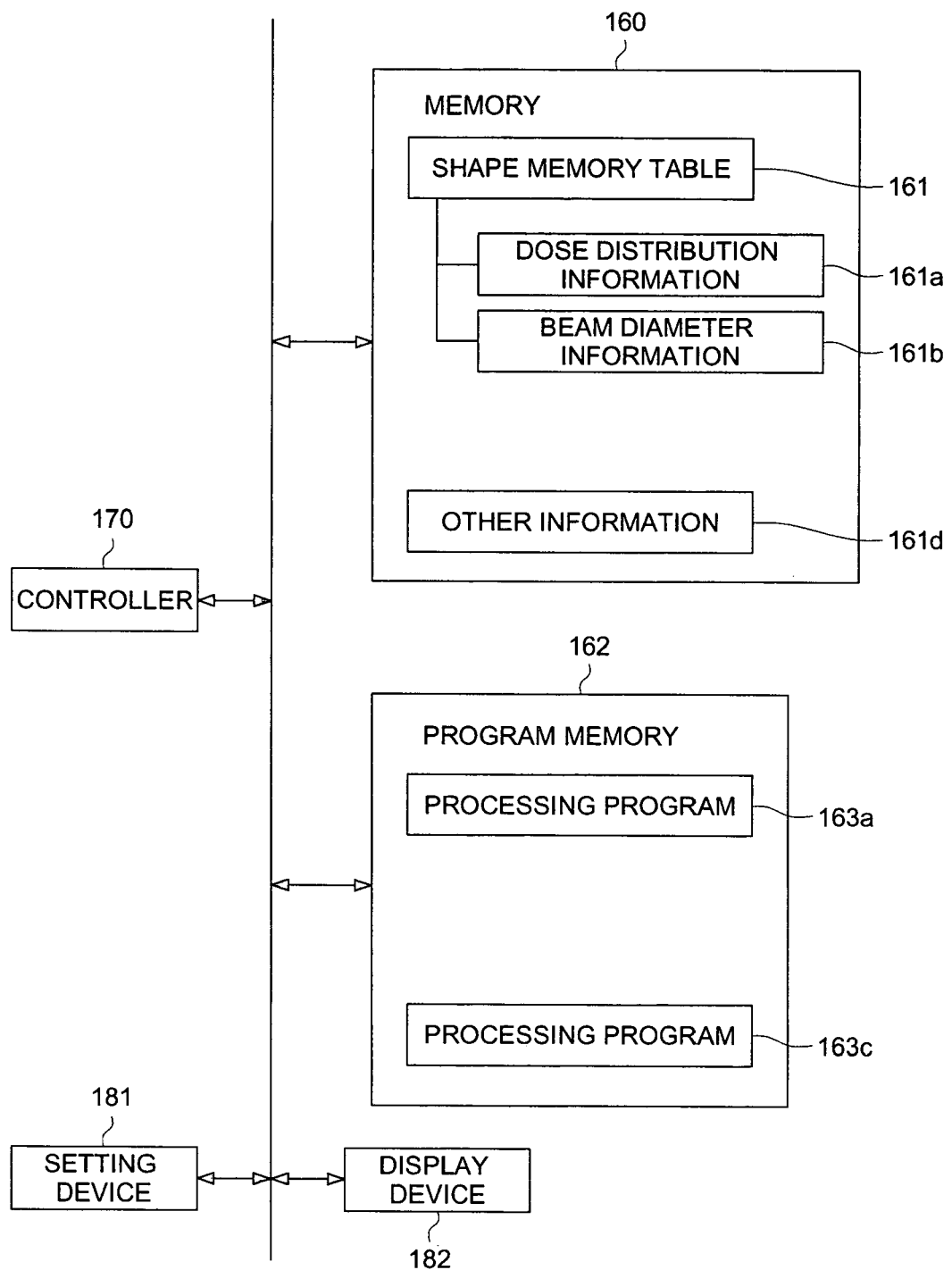
FIG. 10 is a functional block diagram showing details of a controlling system of an electron beam depicting apparatus shown in FIG. 1.

Referring to FIG. 10, the control system in the electron beam depicting apparatus 1 will be described:

As shown in FIG. 10, the memory 160 stores a shape memory table 161. This table contains a dose distribution information 161a for previously defining the distribution of the dose corresponding to each scan position of the side wall 3a and slope 3b of the blaze 3 formed on the curved surface 2a of the substrate 2, and a beam diameter information 161b for previously defining the beam diameter corresponding to each scan position of the side wall 3a and slope 3b of the blaze 3.

The program memory 162 contains a processing program 163a for the controller 170 to apply processing to be described later, and other processing programs 163c.

Incidentally, a setting device 181 shown in FIG. 10 is used to set the dose distribution information 161a and beam diameter information 161b stored in the shape memory table 161 of the memory 160. A display device 182 displays dose distribution information and others for each scanning line.

In such a configuration, the controller 170 calculates the dose corresponding to each scan position of the side wall 3a and slope 3b of the blaze 3, based on the dose distribution information 161a and beam diameter information 161b stored in the shape memory table 161 of the memory 160, according to the processing program 163c. The controller 170 also calculates probe current, scanning pitch and diameter of electron beam B.

The controller 170 controls the electron gun controller 104, field control circuit 118 and lens controller 108, according to the calculated probe current, scanning pitch and diameter of the electron beam B. This arrangement optimizes the probe current, scanning pitch and diameter of electron beam B at the time of patterning. The desired form can be obtained after the patterned substrate 2 has been developed.

The diameter of the electron beam B can also be adjusted by changing the size of the opening of the aperture 18.

(Alternating-bias Signal Superposing Circuit)

Figure 11:
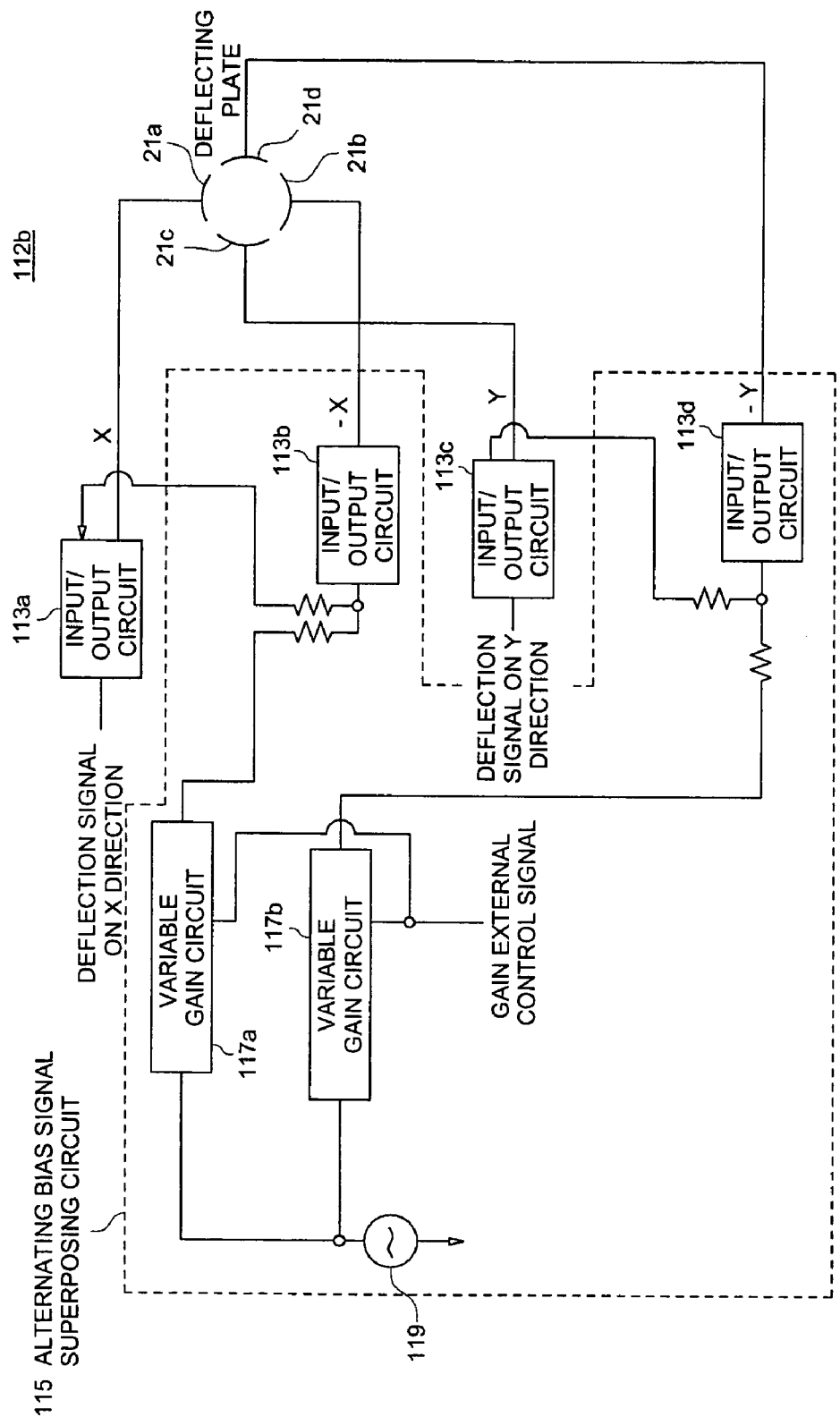
FIG. 11 is an explanatory drawing for explaining a configuration of peripheral sections including a sub-deflecting section of an electron beam depicting apparatus shown in FIG. 1.

Referring the FIG. 11, the following describes a sub-deflector 112b as a portion characteristic of the present invention or a alternating bias signal superposing circuit constituting the sub-deflector 112b, to put it in greater details.

As shown in FIG. 11, the sub-deflector 112b is generated by the field control circuit 118. It comprises: input/output circuits 113a and 113b used to ensure that the deflection signal on X direction defined in the present apparatus for example, or the deflection signal of phase "+" or "−" on X direction, to put it in greater details, is outputted into each of deflecting plates 21a and 21b arranged opposite to the deflector 20, according to the deflection signal entered from the high-speed digital-to-analog converter 114b; input/output circuits 113d and 113d used to ensure that the deflection signal on the Y direction orthogonal to the X direction, or the deflection signal of phase "+" or "−" on Y direction, to put it in greater details, is outputted into each of deflecting plates 21c and 21d arranged opposite to the deflector 20; and a alternating bias signal superposing circuit for superposing an alternating bias signal having a specific frequency (e.g. high frequency signal) on the signal that is inputted into the circuits of either phase (input/output circuits 113b and 113d having the negative phase in this example), out of these input/output circuit's 113a, 113b, 113c and 114d. Incidentally, the input/output circuits 113b and 113d are inputted from the high-speed digital-to-analog converter 114b. The deflection signal of the electron beam B having passed through the input/output circuits 113a and 113c and the alternating bias signal from the alternating bias signal superposing circuit 115 are superposed on each other through processing of addition, and their polarity is reversed at the same time. Further, these input/output circuits 113b and 113d can be formed by a normal operation circuit.

As described above, the electron beam applied from the electron gun 12 is deflected by the deflector 20 through the electron lens 16, and the deflected electron beam B is applied to the position to be patterned on the surface of the substrate 2 on the X-Y-Z stage 30, e.g. on the curved surface 2a, whereby patterning is carried out by electron beam. In this case, when a blaze-shaped diffraction structure is formed on the curved surface 2a of the substrate 2, patterning by electron beam described below will be carried out by the sub-deflector 112b having the aforementioned configuration under the control by the controller 170:

In the following description, it should be understood that "the X direction defined in the present apparatus" and "the Y direction orthogonal to the X direction" agree with the main scanning direction and sub-scanning direction of the electron beam B, respectively. This allows the deflection signal on X direction to correspond to the "first input signal" of the present invention. The deflection signal on Y direction corresponds to the "second input signal" of the present invention.

Figure 12:
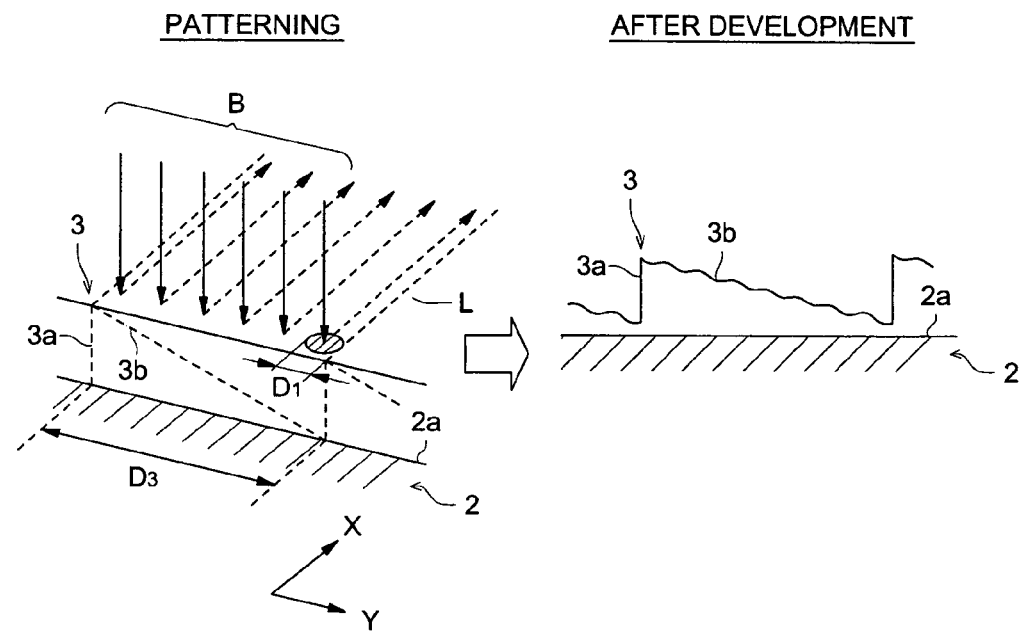
FIG. 12(A) is an explanatory drawing for explaining a conventional depicting method.
FIG. 12(B) is an explanatory drawing for explaining a depicting method performed by an electron beam depicting apparatus shown in FIG. 1.
Figure 12:
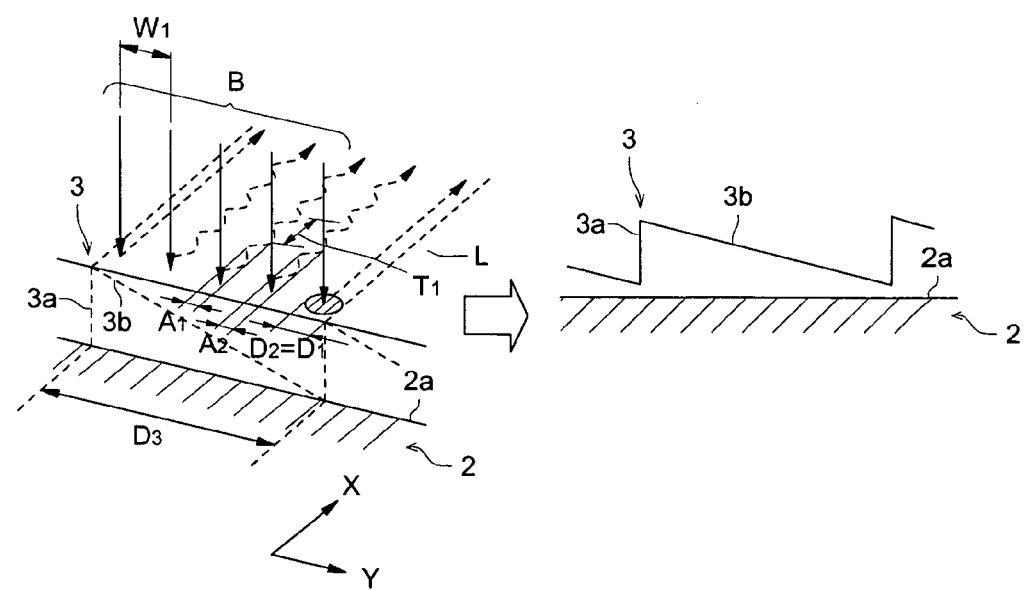

When a blaze-shaped diffraction structure having a pitch $D_3$ is formed on the curved surface 2a of the substrate 2, the diameter of the electron beam B (hereinafter referred to as "beam waist BW) is adjusted to diameter $D_1$ by the electron lens 16 in the prior art, as shown in FIG. 12(A). This is scanned, for example, n-times linearly in the X direction in the FIG. 12(A) in the resist layer L as the layer to be patterned, whereby the side wall 3a and slope 3b of the blaze 3 are formed, according to the prior art.

By contrast, in the electron beam depicting apparatus 1, the beam waist BW of the electron beam B is adjusted to the diameter $D_2=D_1$ by the electron lens 16, as shown in FIG. 12(B). This is scanned, for example, m-times (where m is equal to or smaller than n) in the X direction in the FIG. 12(B) in the resist layer L as the layer to be patterned, whereby the side wall 3a and slope 3b of the blaze 3 are formed.

Figure 13:
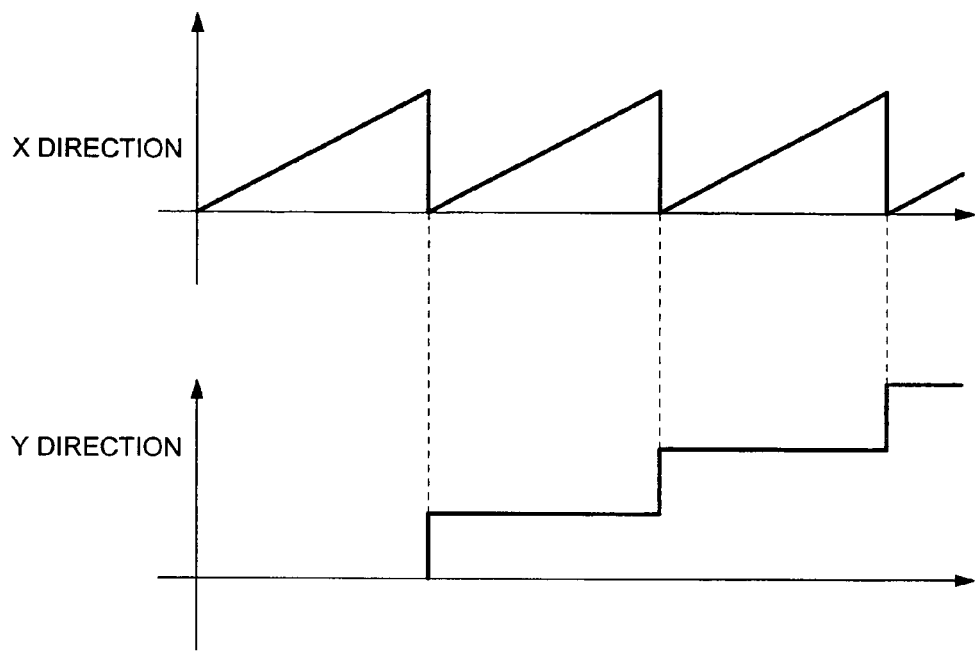
FIG. 13(A) and FIG. 13(B) are explanatory drawings for explaining a process of superposing an alternating bias signal onto a deflection signal by means of an alternating-bias signal superposing circuit at a sub-deflecting section of an electron beam depicting apparatus shown in FIG. 1.
Figure 13:
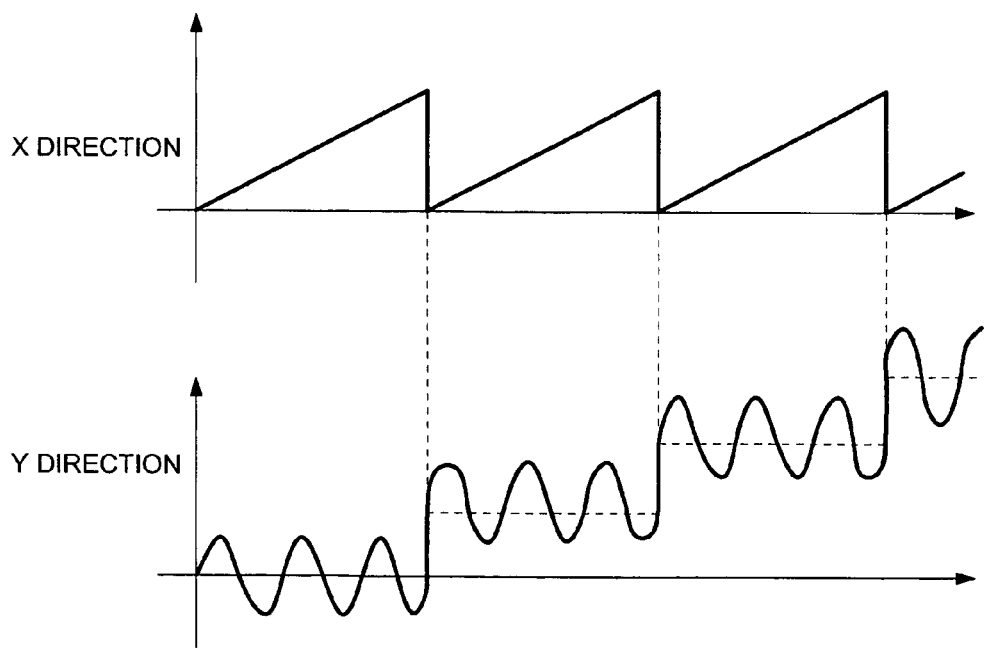

In the electron beam depicting apparatus 1, the alternating bias signal superposing circuit 115 of the sub-deflector 112b superposes an alternating bias signal on the deflection signal on Y direction as a sub-scanning direction of the electron beam B or the deflection signal on Y direction to be inputted into the input/output circuit 113d, to put it in greater details, as shown in FIG. 13(A) and FIG. 13(B), the electron beam B is moved in the Y direction of FIG. 13(A) and FIG. 13(B), on the resist layer L as the layer to be patterned, as shown in FIG. 12(B). Thus, the slope 3b of the blaze 3 is formed by snaking of electron beam B.

The amplitude of the aforementioned alternating bias signal is adjusted according to the configuration of the blaze 3. This adjustment is made in such a way that the amplitude on the locus of the scanning line of the electron beam B is maximized at the center of the slope 3b of the blaze 3, and is reduced as one goes closer to the side wall 3a of the blaze 3, as shown in FIG. 12(B). The details will be described later.

Figure 14:
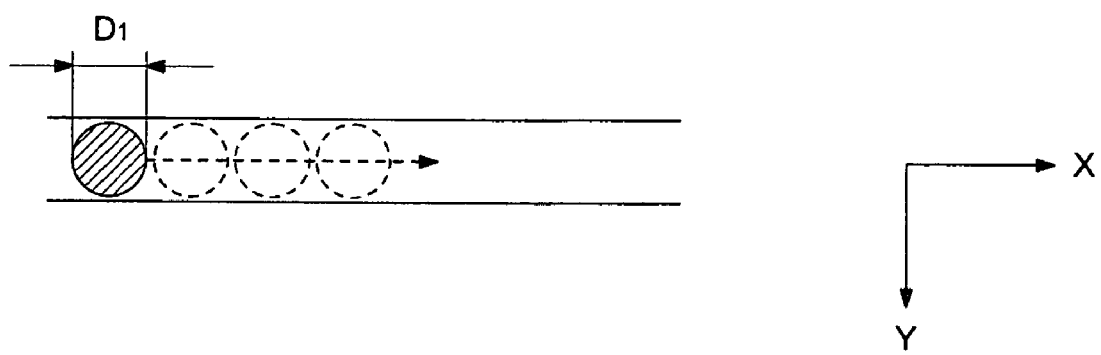
FIG. 14(A) is an explanatory drawing for explaining a depicting area in a conventional scanning operation of an electron beam.
FIG. 14(B) is an explanatory drawing for explaining a depicting area in a scanning operation of an electron beam, performed by an electron beam depicting apparatus shown in FIG. 1.
Figure 14:
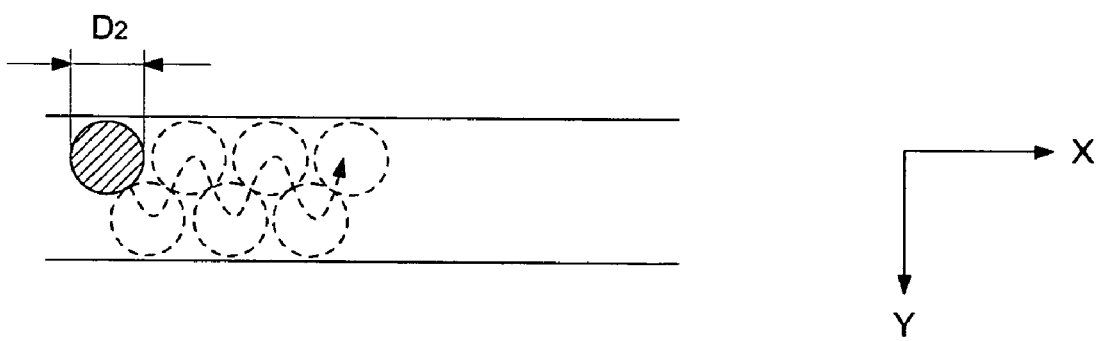

Incidentally, this adjustment is made because, in the patterning of the slope 3b of the blaze 3, a larger beam diameter is required in order to get a smooth form, as described above. By contrast, in the patterning of the vicinity of the side wall 3a of the blaze 3, a small beam diameter must be used in order to get a sharp rising portion. To put it another way, in the electron beam depicting apparatus 1, when the slope 3b of the blaze 3 are patterned, the electron beam B is moved in the sub-scanning direction (Y direction), as shown in FIG. 14(A) and FIG. 14(B), and scanning is performed in the main scanning direction (X direction) by snaking of electron beam B. This method allows patterning to be performed as if electron beam B having a large diameter were used for scanning.

In this example, the X direction is the same as the main scanning direction of the electron beam B. This eliminates the need of superposing an alternating bias signal on the deflection signal on the X direction, or the deflection signal on X direction to be inputted into the input/output circuit 113b.

Further, in the electron beam depicting apparatus 1, control is made to adjust the scanning pitch (patterning interval) of the adjacent electron beams B, in response to the amplitude of the alternating bias signal superposed on the deflection signal on the Y direction as a sub-scanning direction of the electron beam 1 as described above. This will be described later in greater details.

Incidentally, in this example, when a blaze-shaped diffraction structure having a pitch $D_3$ is formed on the curved surface 2a of the substrate 2 by the electron beam depicting apparatus 1 in a similar fashion as before, the number of electron beam scanning operations can be reduced as compared to that in the past. As is apparent from FIGS. 14 (A) and (B), this is because of the following reason: When scanning is in the X direction by snaking of the electron beam B, with the electron beam B moved in the Y direction in FIGS. 14(A) and (B), patterning in the greater range is possible, even if the width $D_2$ of the beam waist BW is the same as the width $D_3$ of the beam waist BW according to the prior art. Incidentally, in either case, the speed of scanning in the X direction is the same. This is because there is no difference between these two cases in the deflection signal on the X direction as the main direction of electron beam B, or the deflection signal on X direction to be inputted into the input/output circuits 113a and 113b, to put it in greater details.

Thus, in the electron beam depicting apparatus 1, scanning is in the X direction by snaking of the electron beam B, with the electron beam B moved in the Y direction, and this arrangement permits patterning to be performed in the greater range as compared to the prior art method, and hence reduces the number of scanning operations by the electron beam, with the result that patterning operation is performed in a shorter period of time. Further, a smoother shape can be gained, even if the number of scanning operations is the same as that in the prior art.

In such a case, in order to reduce the dose of the resist layer L as the layer to the patterned per unit area, the electron gun controller 104 regulates and controls the current and voltage of the electron gun power supply 102 under the control of the controller 170, thereby adjusting (increasing) the amount of electron beam B applied from the electron gun 12.

Going back to FIG. 11, the alternating bias signal superposing circuit 115 includes: variable gain circuits 117a and 117b for adjusting each of the amplitudes of the alternating bias signals superposed on the signals to be inputted into the input/output circuits 113b and 113d, according to the gain external control signal from the controller 170; and a variable frequency circuit 119 for adjusting frequency of the alternating bias signal superposed on the signal to be inputted into the input/output circuits 113b and 113d. Incidentally, variable gain circuits 117a and 117b can be made up of variable resistance attenuator or the like. Further, the variable frequency circuit 119 can be composed of a VCO (Voltage Control Oscillator) or the like.

In the electron beam depicting apparatus 1, as shown in FIG. 12(B), this arrangement makes it possible to adjust the amplitude $A_1$, $A_2$ (where $A_1 > A_2$) on the locus during the scanning operation in the X direction by snaking of the electron beam B, with the electron beam B moved in the Y direction, in the resist layer L as a layer to be patterned.

For example, adjustment is made such a way that the amplitude of the alternating bias signal superposed on the deflection signal on the Y direction as the sub-scanning direction of electron beam B, or the deflection signal on Y direction to be inputted into the input/output circuit 113d, to put it in greater details, in order to ensure that the amplitude on the locus of the scanning line by the electron beam B is maximized at the center of the slope 3b of the blaze 3 by the variable gain circuit 117b, based on the shape of the blaze 3, and is reduced as one goes closer to the side wall 3a of the blaze 3. This adjustment permits adjustment of the amplitudes $A_1$ and $A_2$ on the locus during the scanning operation in the X direction by snaking of the electron beam B, with the electron beam B moved in the Y direction, in the resist layer L as a layer to be patterned, in such a way that the $A_1 > A_2$, as shown in FIG. 12(B).

The alternating bias signal superposed on the deflection signal on the Y direction as the sub-scanning direction of electron beam B, or the deflection signal on Y direction to be inputted into the input/output circuit 113d, to put it in greater details, is a so-called radio frequency signal. It is close to the response frequency band (cut-off frequency), and therefore allows the variable frequency circuit 119 to adjust the frequency on the locus during the scanning operation in the X direction by snaking of the electron beam B, with the electron beam B moved in the Y direction of the figure, in the resist layer L as a layer to be patterned.

As described above, the amplitude of the alternating bias signal superposed on the signal to be inputted to the input/output circuits 113b and 113d is adjusted by the variable gain circuits 117a and 117b, based on the gain external control signal from the controller 170.

In this case, the controller 170 gets information on the shape of the blaze 3 from the shape memory table 161 of the memory 160, and performs operations according to the processing program stored in the program memory 162, thereby working out the amplitude of the alternating bias signal in response to the shape of the blaze 3 and transmitting the information on the amplitude to the variable gain circuits 117a and 117b as a gain external control signal.

The controller 170 controls the scanning pitch (patterning interval) of adjacent electron beams B, in addition to the adjustment of the amplitude on the path of the scanning line of electron beam B by the variable gain circuit 117b. To put it more specifically, in view of the influence of the proximity effect determined by the width $D_2$ of the beam waist BW, amplitudes $A_1$ and $A_2$ on the path of the scanning line of electron beam B, and frequency $1/T_1$ on the path of the scanning line of electron beam B, the controller 170 determines that the patterning interval $W_1$ (see FIG. 12(B)) is a value that ensures the ranges influenced by patterning do not overlap with one another, without any portion leaking from the range influenced by patterning. Incidentally, the influence of the proximity effect determined by the aforementioned width of beam waist BW and amplitude and frequency on the path of the scanning line of electron beam B, namely, information on the range influence by patterning is stored in the memory 160 as other information 161d in advance.

In this case, the controller 170 performs the operations according to the processing program stored in the program memory 162, based on the aforementioned information on the amplitude and frequency of the alternating bias signal and the information on the range influence by patterning stored in the memory 160 as other information 161d, thereby controlling the adjustment of the scanning of the electron beam B in patterning intervals.

(Processing of Patterning)

Figure 15:
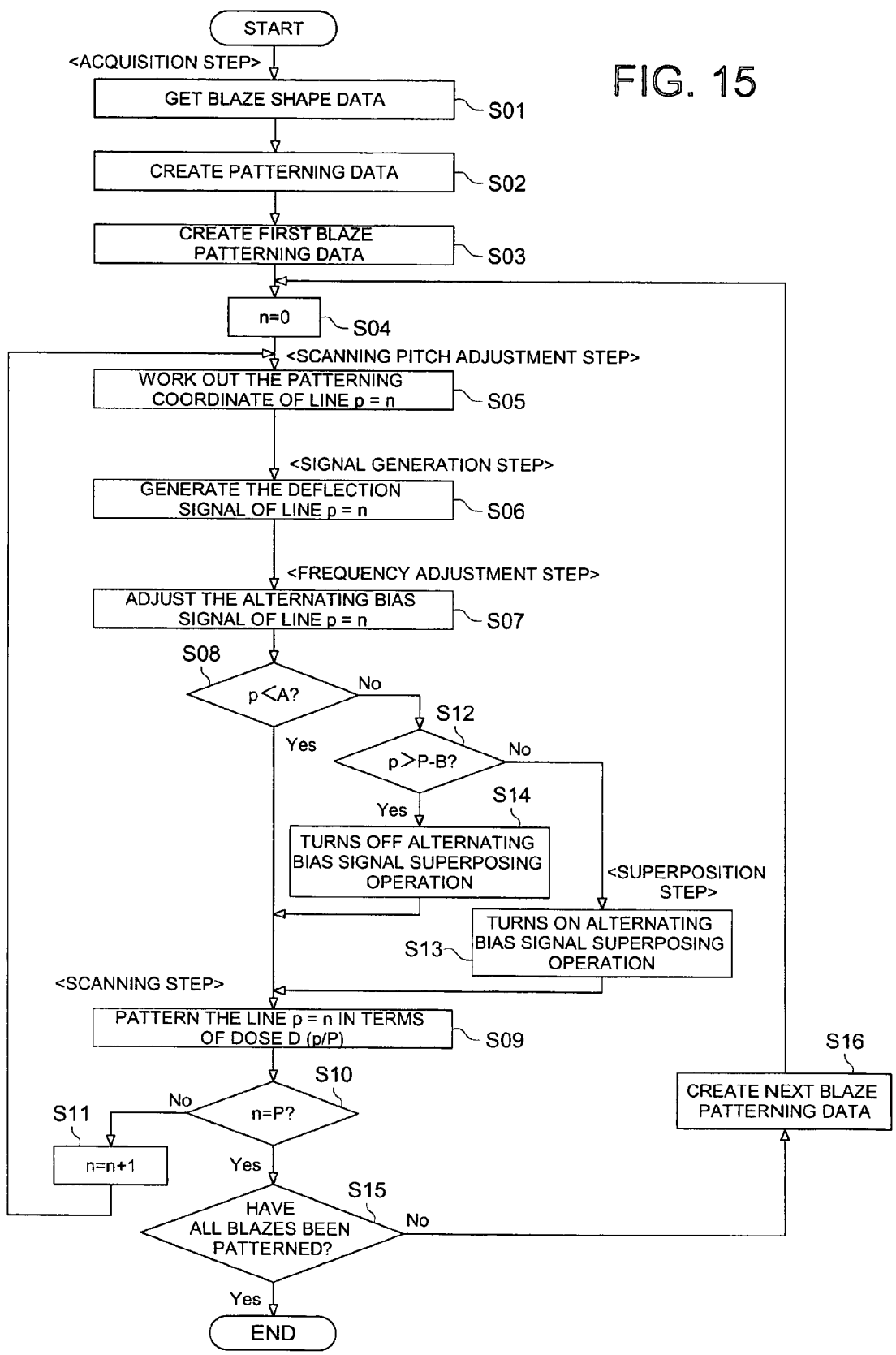
FIG. 15 is a flowchart for explaining a processing flow of a controlling section when blazed gratings are depicted by an electron beam depicting apparatus shown in FIG. 1.
Figure 16:
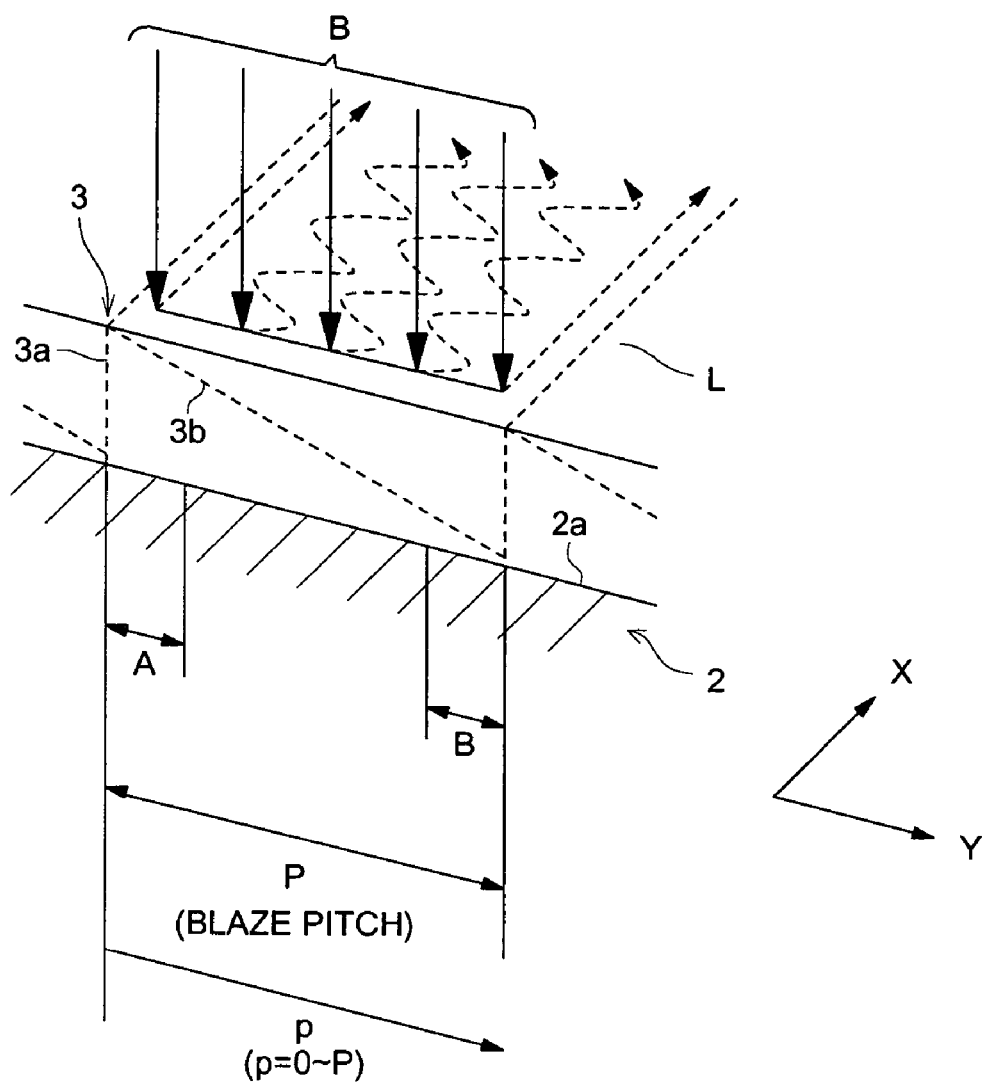
FIG. 16 is an explanatory drawing for explaining a processing of a controlling section when blazed gratings are depicted by an electron beam depicting apparatus shown in FIG. 1.

The following describes the aforementioned processing of patterning of the blaze 3 in the electron beam depicting apparatus 1 with reference to FIG. 15 and FIG. 16. Symbols used in FIGS. 15 and 16 correspond to each other.

<Acquiring Step>

As shown in FIG. 15, when the blaze-shaped diffraction structure is formed on the curved surface 2a of the substrate 2, the controller 170 allows the pattern generation circuit 120 to create the information on the pattern, based on the information on the shape of the blaze 3 stored in the shape memory table 161 of the memory 160 (S01). This step provides the pattern shape data (S02). In this case, the number of the blaze 3 to be patterned and the number of divided fields for patterning are determined.

The controller 170 performs operations according to the processing program stored in the program memory 162. The patterning data on the first blaze 3 (blaze to be patterned first), or the dose function D (x) [x=p/P] in response to the shape of the blaze 3, to put it more specifically, is determined, and the pitch P is set (S03).

<Scanning Pitch Adjustment Step>

The controller 170 works out the patterning coordinate of the line p=n (=0), based on n=0 (where n: initial set value) (S05).

<Signal Generation Step>

The controller 170 generates the deflection signal of the line p=n (=0) (S06). To put it more specifically, the deflection signal to be inputted into the sub-deflector 112b is generated so that the line p=n (=0) is formed by the field control circuit 118.

<Frequency Adjustment Step>

The controller 170 allows the alternating bias signal superposing circuit 115 of the sub-deflector 112b to generate the alternating bias signal superposed on the deflection signal of line p=n (=0) (S07). In this case, the amplitude of the alternating bias signal is adjusted.

<Determination Step>

The controller 170 determines if p<A or not (FIG. 16) (S08). Needless to say, since p (=0)<A is established (Yes in S08) at first, the controller 170 permits the line p=n (=0) to be patterned at the scanning speed conforming to the dose given in terms of the dose function D (x) [x=p/P] (S09).

The controller 170 determines if n=P (S10) or not. Needless to say, since n (=0)=P does not hold true (No in S10) at first, the controller 170 works out the coordinate for patterning the line p=n (=1) (S05), based on n=n+1 (=1) (S11). The steps from S05 through S11 are repeated until p>A is obtained.

S05 through S09 and S12 in FIG. 15 and symbol "p" shown in FIG. 16 denote the pitches on the p-th scanning lines to be patterned. Further, the S08 in FIG. 15 and symbol "A" in FIG. 16 show the pitch where there is no superposing of the alternating bias signal by the alternating bias signal superposing circuit 115 of the sub-deflector 112b. It is preset in the memory 160 by the setting device 181 as other information 161d.

<Superposing Step>

When p>A holds true (No in S08), the controller 170 determines if p>P−B or not (S12). Needless to say, since p<P−B hold true (FIG. 6) (No in S12) at first, the controller 170 starts the superposing operation of the alternating bias signal through the alternating bias signal superposing circuit 115 of the sub-deflector 112b (S13).

<Scanning Step>

The controller 170 permits the line p=n to be patterned at the scanning speed conforming to the dose given in terms of dose function D (x) [x=p/P] (S09). In this case, however, the aforementioned alternating bias signal superposing circuit 115 of the sub-deflector 112b superposes alternating bias signals to the deflection signal on the Y direction as the sub-scanning direction of electron beam B, or the deflection signal on Y direction to be inputted into the input/output circuit 113d, to put it in greater details. Thus, scanning operation is carried out by the electron beam B shifted in the sub-scanning direction and applied in a snake-like motion.

The controller 170 determines if p=n or not (S10). Needless to say, since p=n does not hold true (No in S10), the controller 170 works out the coordinate for patterning the line p=n (S05), based on n=n+1 (S11). The steps from S05 through S11, namely, <Scanning pitch adjustment step> through <Scanning step> are repeated until p>P−B is obtained.

The symbol "B" given in the S12 of FIG. 15 and FIG. 16 denotes the pitch showing the range where alternating bias signal is not superposed by the alternating bias signal superposing circuit 115 of the sub-deflector 112b. It is set in the memory 160 as other information 161d by the setting device 181.

When the p>P−B has been achieved (Yes in S12), the controller 170 terminates the superposing operation of alternating bias signal by the alternating bias signal superposing circuit 115 of the sub-deflector 112b (S14). Then the controller 170 permits the line p=n to be patterned at the scanning speed conforming to the dose given in terms of the dose function D (x) [x=p/P] (S09). Then it determines if n=P or not (S10). Needless to say, since n=p does not hold true (No in S10), the controller 170 works out the coordinate for patterning the line p=n (S05), based on n=n+1 (S11). The steps from S05 through S11, namely, <Scanning pitch adjustment step> through <Scanning step> are repeated until n=P is obtained.

When n=P holds true (Yes in S10), the controller 170 determines if pattering of all blazes 3 has terminated or not (S15). Needless to say, since patterning is not terminated at first (No in S15), the patterning data for the next blaze 3 is created (S16). The steps from S04 through S16, namely, <Scanning pitch adjustment step> through <Scanning step> are repeated until pattering of all blazes 3 terminates (Yes in S15).

MANUFACTURING METHOD OF THE METALLIC MOLD

The aforementioned precision working of a diffraction structure or the like on a substrate by the electron beam depicting apparatus of the present invention has been disclosed in the above description. The following describes the process related to all the aforementioned steps, i.e. the process of manufacturing the metallic mold for producing an optical lens such as optical element through molding.

Figure 17:
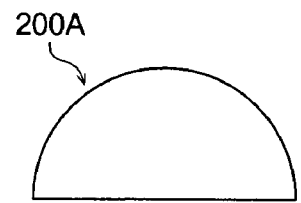
FIG. 17(A), FIG. 17(B), FIG. 17(C), FIG. 17(D), FIG. 17(E), and FIG. 17(F) are explanatory drawings for explaining an overall processing procedure when forming a metallic mold for molding an optical element by employing the substrate.
Figure 17:
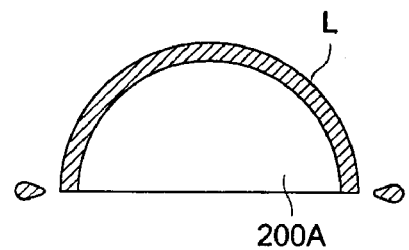
Figure 17:
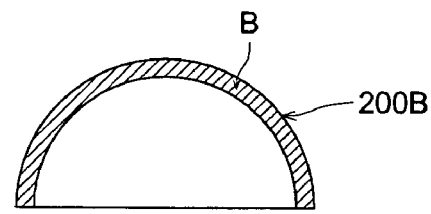
Figure 17:
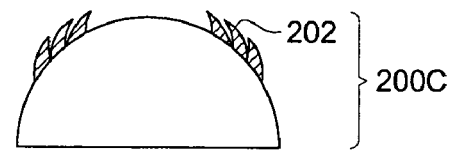
Figure 17:
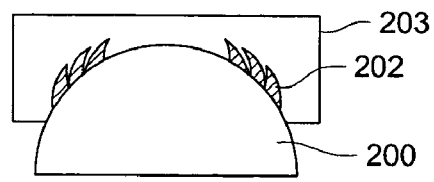
Figure 17:

In the first place, a metallic mold (electroless nickel, etc.) is working by machining (machining process). As shown in FIG. 17(A), the metallic mold is used to produce a substrate 200A having a basic optical surface consisting of predetermined curved surfaces, through plastic molding (plastic molding process). Further, substrate 200A is dried after having been washed.

Then the substrate 200A is subjected to surface treatment (plastic surface treatment process). Silver deposition, for example, is carried out in this process. To put it more specifically, the substrate 200A is positioned and the spinner is rotated while a resist L is dropped, whereby spin coating is performed. Further, pre-baking is also carried out. This arrangement provides a substrate 200A with the resist film formed on the basic optical surface.

After pin-coating, the thickness of the aforementioned resist film is measured and the resist film is evaluated (resist film evaluation process). Further, as shown in FIG. 17(C), while the substrate 200B is positioned and the substrate 200B is controlled through X, Y and Z axes, patterning (exposure) is performed on the resist film by electron beam B, in conformity to the predetermined pattern (diffraction structure in this case) to be formed on the substrate 200B.

The resist film L on the substrate 200B is subjected to surface smoothing treatment (surface smoothing process). Further, as shown in FIG. 17(D), processing of development is applied while the substrate 200B is positioned (development process). In this case, the range affected by patterning with electron beam B, i.e. the exposed portion is removed, and a predetermined pattern 202 is formed on the basic optical surface. Then surface hardening treatment is performed.

The next is the process of evaluating the resist shape by SEM observation and use of a film thickness measuring instrument (resist shape evaluation process).

Dry etching is carried out if etching is required to get a predetermined shape, namely if a predetermined shape is to be gained by further etching of the resist shape obtained in the process of development. In this way, a mother die as a die master having a predetermined shape is obtained. Metal is evaporated on the resist surface of the mother die 200C and pre-treatment for electroforming of the metallic mold is carried out (metal evaporation process).

As shown in FIG. 17(E), electroforming is applied to the mother die 200C having been subjected to surface treatment, thereby creating an electroformed member 203 with a predetermined structure transferred to the mother die 200C. Then processing is applied to separate between the mother die 200C and metallic mold 204, as shown in FIG. 17(F), and the metallic mold 204 is obtained by working the external shape.

Surface treatment is applied to the metallic mold 204 separated from the mother die 200C having been subjected to surface treatment (metallic mold surface treatment process). Then the metallic mold 204 is evaluated.

Thus, the aforementioned steps provide easy production of the metallic mold for injection molding of the optical element to be described later.

MANUFACTURING METHOD OF THE OPTICAL ELEMENT

The above description has explained the process of manufacturing the metallic mold for producing an optical lens such as optical element through molding. The following describes the process related to all of the aforementioned step, i.e. the process of manufacturing an optical lens such as optical element through molding.

Figure 18:
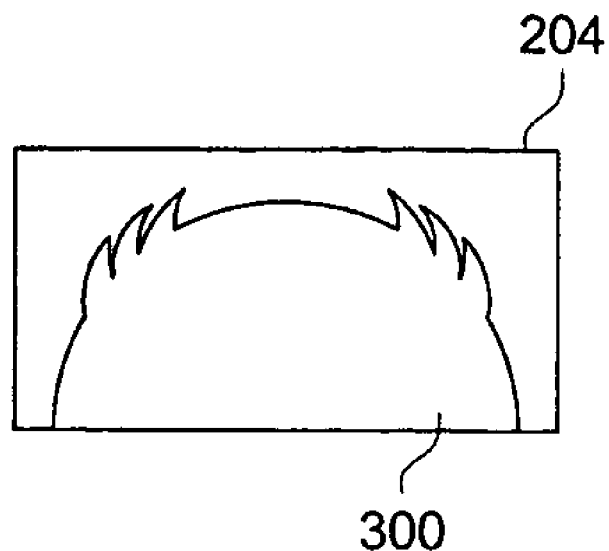
FIG. 18(A) and FIG. 18(B) are explanatory drawings for explaining an overall processing procedure when molding an optical element by employing the metallic mold.
Figure 18:
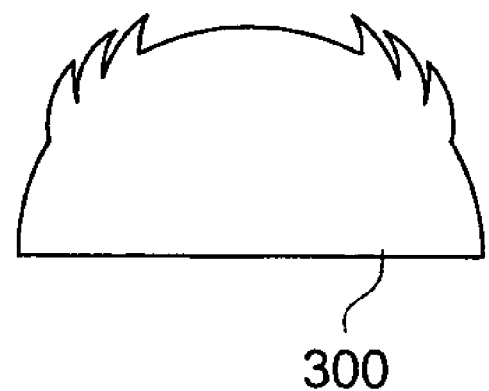

The metallic mold 204 having been evaluated as described above is used to perform plastic molding for getting a molded product 300, as shown in FIG. 18(A) (plastic molding process). Then as shown in FIG. 18(B), the molded product 300 is dried after having been washed. The molded product 300 is then evaluated. If it has passed the evaluation test, the molded product 300 is regarded as a commercial optical element.

The following describes a concrete embodiment of the present invention.

Figure 19:
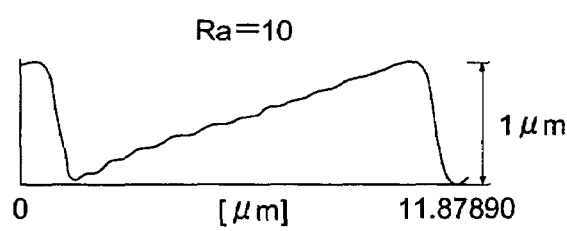
FIG. 19(A) and FIG. 19(B) are cross sectional views of slope surfaces of the blaze shape, showing comparison between a finished surface processed by conventional method and that by a method of the present invention.
Figure 19:
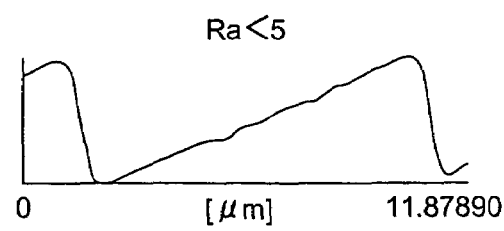

Material to be patterned: Positive resist coated on the PMMA resin
Targeted finish surface: Surface roughness<Ra 10 nm
Dose (irradiation amount of electron beam):
  Acceleration voltage; 50 kV
  Probe current; approximately 1 nA
  Dose; up to 300 µC/cm$^2$
Scanning speed in the main scanning direction:
  100 nm/µ sec through 15 nm/µ
Deflection frequency in the sub-scanning direction:
  2 MHz at present
Deflection amplitude in the sub-scanning direction:
  Amplitude overlapping with at least adjacent scanning line FIG. 19(A) and FIG. 19(B) show the result of patterning under the aforementioned conditions. FIG. 19(A) shows the profile of the surface of the patterned resist surface without superposing alternating bias (as a comparative example). FIG. 19(B) shows the profile of the surface of the patterned resist surface with superposing alternating bias (as a particular embodiment). With superposing alternating bias, the roughness of the patterned resist surface is no more than 5 nm (Ra). Without superposing alternating bias, the roughness of the patterned resist surface is approximately 10 nm (Ra). As mentioned in the above, more smooth surface can be obtained with superposing alternating bias.

The deflection frequency in the sub-scanning direction is preferred to be capable of deflecting one cycle or more in the sub-scanning direction within one-clock cycle. To put it another way, it is preferred that the deflection frequency in the sub-scanning direction be equal to or greater than the dot clock frequency of the main scanning (normally, about 10 MHz). In practice, it is difficult to adopt such a frequency due to the problems involved in the circuit response. Further, a smooth finish surface cannot be easily obtained on the low-dose portion (high-speed scan portion in the main scanning direction). There is no difference in the deflection frequency of several MHz.

The above arrangement ensures easy manufacture of an optical element.

As described above, the electron beam depicting apparatus of the present invention provides a smooth sloped surface and a sharp rising portion of the edge using a small-diagram beam, and reduce the patterning time at the same time.

Disclosed embodiment can be varied by a skilled person without departing from the spirit and scope of the invention.

What is claimed is:

1. An electron beam depicting method for depicting a predetermined pattern on a substrate, comprising the steps of:
  acquiring shape data of said predetermined pattern;
  generating a first input signal for deflecting an electron beam emitted from an electron gun in a main-scanning direction, and a second input signal for deflecting said electron beam emitted from said electron gun in a sub-scanning direction, based on said shape data of said predetermined pattern;
  adjusting an alternating bias signal, having a specific frequency, according to said shape data of said predetermined pattern;
  superposing said alternating bias signal on said second input signal; and
  deflecting said electron beam emitted from said electron gun in said sub-scanning direction according to said second input signal on which said alternating bias signal is superposed, while scanning said electron beam emitted from said electron gun by deflecting it in a main-scanning direction.

2. The electron beam depicting method of claim 1, wherein an amplitude of said alternating bias signal is adjusted in response to said shape data of said predetermined pattern in said adjusting step.

3. The electron beam depicting method of claim 1, wherein a structure of said predetermined pattern includes a plurality of edge portions.

4. The electron beam depicting method of claim 1, wherein said predetermined pattern is a diffraction structure constituted by a plurality of blazed diffraction gratings; and
  wherein said alternating bias signal is adjusted corresponding to a sloped area and an edge portion of each of said blazed diffraction gratings in said adjusting step.

5. The electron beam depicting method of claim 4, wherein an amplitude of said alternating bias signal is adjusted to a first amplitude value in a vicinity of said edge portion, while said amplitude of said alternating bias signal is adjusted to a second amplitude value in a vicinity of a center of said sloped area; and
  wherein said first amplitude value is smaller than said second amplitude value.

6. The electron beam depicting method of claim 1, further comprising the step of;

controlling a scanning pitch in said sub-scanning direction of said electron beam in response to an amplitude of said alternating bias signal.

7. The electron beam depicting method of claim 1, wherein a depicted surface of said substrate is a curved surface.

8. An electron beam depicting apparatus for depicting a predetermined pattern on a substrate by irradiating an electron beam onto said substrate, comprising:

an electron-beam irradiating section to irradiate said electron beam onto said substrate;

an electron-beam deflecting section to deflect said electron beam irradiated from said electron-beam irradiating section;

a storage section to store shape data of said predetermined pattern; and a controlling section to control said electron-beam irradiating section and said electron-beam deflecting section, based on said shape data of said predetermined pattern stored in said storage section;

wherein said controlling section includes:

a first-signal generating circuit to generate a first signal for deflecting said electron beam in a main-scanning direction;

a second-signal generating circuit to generate a second signal for deflecting said electron beam in a sub-scanning direction;

an alternating-bias signal adjusting circuit to adjust an alternating bias signal having a specific frequency; and an alternating-bias signal superposing circuit to superpose said alternating bias signal on said second signal.

9. The electron beam depicting apparatus of claim 8, wherein said shape data of said predetermined pattern, stored in said storage section, include dose distributing information, which are defined as dose distributions corresponding to each of scanning positions on said substrate.

10. The electron beam depicting apparatus of claim 8, wherein said alternating-bias signal adjusting circuit adjusts an amplitude of said alternating bias signal in response to said shape data of said predetermined pattern.

11. The electron beam depicting apparatus of claim 10, wherein said predetermined pattern is a diffraction structure constituted by a plurality of blazed diffraction gratings; and wherein said alternating-bias signal adjusting circuit adjusts said alternating bias signal so that said amplitude of said alternating bias signal varies corresponding to a sloped area and an edge portion of each of said blazed diffraction gratings.

12. The electron beam depicting apparatus of claim 11, wherein said alternating-bias signal adjusting circuit adjusts said amplitude of said alternating bias signal to a first amplitude value in a vicinity of said edge portion, while said alternating-bias signal adjusting circuit adjusts said amplitude of said alternating bias signal to a second amplitude value in a vicinity of a center of said sloped area; and wherein said first amplitude value is smaller than said second amplitude value.

13. The electron beam depicting apparatus of claim 12, wherein said controlling section also adjusts a deflection pitch, with which said electron beam is deflected in said sub-scanning direction according to said second signal, corresponding to said amplitude of said alternating bias signal adjusted by said alternating-bias signal adjusting circuit.

* * * * *